United States Patent
Kajigaya

(10) Patent No.: US 7,898,895 B2
(45) Date of Patent: Mar. 1, 2011

(54) SEMICONDUCTOR DEVICE

(75) Inventor: Kazuhiko Kajigaya, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 11/902,006

(22) Filed: Sep. 18, 2007

(65) Prior Publication Data

US 2008/0068909 A1  Mar. 20, 2008

(30) Foreign Application Priority Data

Sep. 20, 2006  (JP) ................. 2006-255075

(51) Int. Cl.
*G11C 8/00* (2006.01)
*G11C 7/00* (2006.01)
(52) U.S. Cl. ............... 365/230.05; 365/230.06; 365/205; 365/207; 365/208; 365/189.05
(58) Field of Classification Search ................. 365/205, 365/207, 208, 189.05, 230.03, 230.06, 230.05
See application file for complete search history.

(56) References Cited

U.S. PATENT DOCUMENTS

| | | | | |
|---|---|---|---|---|
| 4,541,076 A | * | 9/1985 | Bowers et al. | 365/230.05 |
| 4,931,999 A | * | 6/1990 | Umeki | 365/230.05 |
| 5,229,971 A | * | 7/1993 | Kiryu et al. | 365/230.06 |
| 5,276,641 A | * | 1/1994 | Sprogis et al. | 365/207 |
| 5,329,494 A | * | 7/1994 | Suzuki et al. | 365/230.03 |
| 5,812,469 A | * | 9/1998 | Nadeau-Dostie et al. | 365/230.05 |
| 5,881,006 A | * | 3/1999 | Yabe et al. | 365/207 |
| 5,940,329 A | * | 8/1999 | Seitsinger et al. | 365/207 |
| 6,034,910 A | * | 3/2000 | Iwase | 365/230.03 |
| 6,104,663 A | * | 8/2000 | Kablanian | 365/230.05 |
| 6,108,254 A | * | 8/2000 | Watanabe et al. | 365/207 |
| 6,314,040 B1 | * | 11/2001 | Reynolds | 365/207 |
| 6,430,080 B1 | * | 8/2002 | Honigschmid et al. | 365/207 |
| 6,885,598 B2 | * | 4/2005 | Kamoshida et al. | 365/207 |
| 7,110,304 B1 | * | 9/2006 | Yu et al. | 365/189.02 |
| 7,286,426 B2 | * | 10/2007 | Nagami et al. | 365/207 |
| 2003/0193832 A1 | | 10/2003 | Okuyama et al. | |
| 2004/0037107 A1 | | 2/2004 | Matsuoka | |

FOREIGN PATENT DOCUMENTS

JP  2003-308690  10/2003
JP  2004-86970  3/2004

* cited by examiner

*Primary Examiner* — Trong Phan
(74) *Attorney, Agent, or Firm* — McGinn IP Law Group, PLLC

(57) ABSTRACT

A semiconductor device of the invention comprises: a memory cell array including memory cells formed at intersections between word lines and bit lines; first and second input/output ports each defined for inputting/outputting data of the memory cell array; sense amplifiers for amplifying data of the memory cells through the bit lines; a first select circuit which is controlled to be on/off by first select control lines extending in an intersecting direction to bit lines and is connected between the sense amplifiers and the first input/output port; a second select circuit which is controlled to be on/off by second select control lines extending along the bit lines and is connected between the sense amplifiers and the second input/output port; and first and second column decoders for selectively activating the first and second select control lines in response to an input column address.

32 Claims, 16 Drawing Sheets

SEMICONDUCTOR DEVICE

BACKGROUND OF THE INVENTION

1. Field of the Invention

The present invention relates to a semiconductor device having a function of DRAM interface, and particularly relates to a semiconductor device in which a DRAM circuit having the function of the DRAM interface and a logic circuit are mixed.

2. Description of the Related Art

Recently, as semiconductor devices with higher density and higher functions are achieved, a semiconductor device in which a DRAM circuit and other logic circuits are mixed on a single chip is desired as well as a general DRAM. In such a semiconductor device, a configuration for inputting/outputting data of a memory cell array and for transferring data between the DRAM circuit and the logic circuits is required. For example, when a logic circuit for performing high-speed operation such as image processing is mixed in the chip, high capacity data is input/output from/to a memory circuit so as to perform the high-speed operation. Thus, an input/output port having a wide bit width is required to be provided in the DRAM circuit and to be connected to the logic circuit.

FIG. 15 shows a specific example of the DRAM circuit including the input/output port having a wide bit width. In FIG. 15, a memory block 100 is configured in which there are provided a large number of memory cells MC formed at intersections between a plurality of word lines WL and a plurality of bit lines BL, a plurality of sense amplifiers SA for amplifying data of the memory cell MC for each bit line pair BP, and a plurality of select transistors ST inserted in each bit line BL in series. In the example of FIG. 15, the sense amplifiers SA and the select transistors ST are symmetrically arranged on both sides of the memory block 100. Further, a column decoder 101 selectively activates two select control lines 102 connected to gates of the select transistors ST on the both sides in response to an input column address.

In the DRAM circuit of FIG. 15, one ends of the select transistors ST on both sides of the bit lines BL are defined as an input/output port. This input/output port includes a pair of terminals P-0T and P-0B, a pair of terminals P-1T and P-1B, a pair of terminals P-2T and P-2B, and a pair of terminals P-3T and P-3B each corresponding to the bit line pair BP, and transmits data of 4 bits in total. Since a large number of bit lines BL are actually arranged in the memory block 100, a predetermined bit width larger than 4 bits is secured. The input/output port is commonly set for the both sides of the bit lines BL, and is connected through input/output lines (not shown) outside the memory block 100. An internal logic circuit or the like is connected to the input/output port, and multi-bit data can be transferred at high speed between the memory block 100 and the logic circuit.

Meanwhile, it is desirable that the above-mentioned logic circuit mixed DRAM is configured to be capable of being controlled from outside as the same manner in the general DRAM. In this case, it is necessary to provide an input/output port having a narrow bit width corresponding to general DRAM interface so as to be connected to the outside.

FIG. 16 shows a specific example of the DRAM circuit including the input/output port having a narrow bit width. In a memory block 200 as shown in FIG. 16, the basic configuration is common to FIG. 15, but arrangements of the select transistors ST and the input/output port is different from those in FIG. 15. Each bit line is connected to one end of each select transistor ST, and an input/output port is defined via input/output lines in a direction orthogonal to the bit lines BL connected to the other end of each select transistor ST. Further, a column decoder 201 selectively activates four select control lines 202 connected to gates of the select transistors ST each corresponding to a bit line pair BP in response to an input column address. The select control lines 202 of FIG. 16 are arranged approximately in parallel with the bit lines BL, as compared with that the select control lines 102 of FIG. 15 are arranged in a direction orthogonal to the bit lines BL.

In the DRAM circuit of FIG. 16, the above-mentioned input/output port includes a pair of terminals P-0T and P-0B and a pair of terminals P-1T and P-1B, and transmits data of 2 bits in total. In the example of FIG. 16, even when a large number of bit lines BL are arranged in the memory block 200, the bit width is 2 bits. The input/output port is externally connected through the input/output lines outside the memory block 200, and data transfer according to the general DRAM interface can be performed.

However, if the configuration of FIG. 15 is applied to the logic circuit mixed DRAM, for example, mismatch in bit width occurs by commonly using the input/output port having a wide bit width in data transfer to the outside. Thus, an extra control circuit for adjusting different bit widths needs to be provided, and it is a problem that chip area and consumption current increase. Inversely, when the configuration of FIG. 16 is applied to the logic circuit mixed DRAM, it becomes difficult to transfer high capacity data at high speed between the DRAM and the internal logic circuit as shown in FIG. 15.

Meanwhile, a multi port DRAM is conventionally known in which a plurality of input/output ports are added to a memory cell array (see Japanese Patent Laid-Open No. 2003-308690 and Japanese Patent Laid-Open No. 2004-86970). In this case, a configuration can be considered in which a logic circuit mixed DRAM is multi-ported, and two input/output ports connected to the memory cell array are provided to be used separately. However, in the conventional multi port DRAM, it is not assumed that two input/output ports having different use purposes and largely different bit widths are provided, which is difficult in terms of the configuration of the memory cell array and its peripheral circuit. In this manner, when configuring the logic circuit mixed DRAM, it is difficult to use an input/output port having a wide bit width for data transfer to an internal circuit and a general input/output port having a narrow bit width for external data transfer at the same time, and therefore highly efficient data access is not achieved.

BRIEF SUMMARY OF THE INVENTION

An object of the present invention is to provide a semiconductor device suitable for achieving a memory circuit mixed with a logic circuit without complexity in control and configuration, in which two input/output ports having different use purposes and different bit widths are provided for inputting/outputting data, and data transfer to/from an internal circuit and data transfer to/from the outside can be both performed at the same time.

An aspect of the present invention is a semiconductor device comprising: a memory cell array including a plurality of memory cells formed at intersections between a plurality of word lines and a plurality of bit lines; a first input/output port defined for inputting/outputting data of said memory cell array; a second input/output port defined for inputting/outputting data of said memory cell array; a plurality of sense amplifiers for amplifying data of the memory cells through the plurality of bit lines; a first select circuit which is controlled to be on/off by one or more first select control lines extending in an intersecting direction to the plurality of bit lines and is connected between said plurality of sense amplifiers and said first input/output port; a second select circuit which is controlled to be on/off by one or more second select control lines extending along the plurality of bit lines and is connected between said plurality of sense amplifiers and said second input/output port; a first column decoder for selectively activating the first select control lines in response to an input column address; and a second column decoder for selectively activating the second select control lines in response to the input column address.

Another aspect of the present invention is a semiconductor device comprising: a memory cell array including a plurality of memory cells formed at intersections between a plurality of word lines and a plurality of bit lines; a first input/output port having a first bit width defined for inputting/outputting data of said memory cell array; a second input/output port having a second bit width defined for inputting/outputting data of said memory cell array; a plurality of sense amplifiers for amplifying data of the memory cells through the plurality of bit lines; a first select circuit which is controlled to be on/off by one or more first select control lines and is connected between said plurality of sense amplifiers and said first input/output port; a second select circuit which is controlled to be on/off by one or more second select control lines and is connected between said plurality of sense amplifiers and said second input/output port; a first column decoder for selectively activating the first select control lines in response to an input column address; and a second column decoder for selectively activating the second select control lines in response to the input column address, wherein the first bit width is larger than the second bit width.

According to the semiconductor device of the present invention, by configuring two input/output ports having different bit widths from each other for the memory cell array, the first select circuit is controlled to be on/off by the first select line which is activated by the first column decoder, so that data is input/output through the first input/output port. Then, the second select circuit is controlled to be on/off by the second select line which is activated by the second column decoder, so that data is input/output through the second input/output port. In this case, the first input/output port capable of data transfer through a large number of adjacent bit lines can have a wide bit width, and thus is suitable for high-speed data transfer from/to an internal circuit. On the contrary, the second input/output port capable of inputting/outputting only limited data has a narrow bit width, but is suitable for utilizing general input/output interface. In this manner, since two input/output ports having different bit widths and different uses can be used at the same time, data access efficiency can be improved without adding an extra control circuit while maintaining generality.

In the present invention, said first input/output port may be connected to an internal circuit, and said second input/output port may be connected to an outside.

In the present invention, two bit lines as a complementary pair may constitute a bit line pair, the memory cell may be formed at one of two intersections between the bit line pair and the word line, and each of the sense amplifiers may be arranged corresponding to the bit line pair. In this case, both said first and second input/output ports may have a plurality of terminals and two of the terminals corresponding to the bit line pair may transmit one bit. Further, each of the second select control lines may be arranged corresponding to the bit line pair and said second column decoder may selectively activate the second select control lines the number of which is the same as the number of the bit lines.

In the present invention, said plurality of sense amplifiers, said first select circuit and said second select circuit may be symmetrically arranged at both ends in a bit line extending direction. In this case, said first select circuit may be controlled to be on/off by the first select control lines different from each other at both ends in the bit line extending direction, and the same said first input/output port may be defined at both ends in the bit line extending direction. Further, said first select circuit may be controlled to be on/off by the common first select control lines at both ends in the bit line extending direction, and half of the terminals of said first input/output port may be respectively defined at both ends in the bit line extending direction separately.

In the present invention, said first select circuit may include a plurality of select transistors each of which is connected at one end to one bit line on a side of the sense amplifier and is connected at the other end to one terminal of said first input/output port. Further, said second select circuit may include a plurality of select transistors each of which is connected at one end to one bit line on a side of the sense amplifier and is connected at the other end to one terminal of said second input/output port.

In the present invention, a plurality of latch circuits each for storing data amplified by the sense amplifier may be provided between said plurality of sense amplifiers and said first select circuit. Further, the present invention may further comprise switching means for switchingly controlling a connection state between said plurality of latch circuits and said plurality of sense amplifiers. In this case, said switching means may include a plurality of switch transistors arranged between said plurality of sense amplifiers and said second select circuit. Further, said switching means may include a plurality of switch transistors arranged between said second select circuit and said plurality of latch circuits.

In the present invention, the respective terminals of said first input/output port may be commonly connected to the sense amplifiers adjacent to one another in an arranging direction of the bit lines, and said first select circuit may be controlled to be on/off by the first select control lines different from one another corresponding to the respective sense amplifiers.

The present invention may further comprise third to N-th input/output ports having the same bit width as said first input/output port which are defined for inputting/outputting data of said memory cell array, wherein said first select circuit may be connected between said plurality of sense amplifiers and said first, third to N-th input/output ports, and may be controlled to be on/off by the first select control lines different from one anther.

In the present invention, a unit memory block may include said plurality of sense amplifiers, said first select circuit and said second select circuit, and a memory circuit may be configured by arranging said first column decoder and said second column decoder for a plurality of the unit memory blocks. In this case, the plurality of the unit memory blocks may be arranged in a direction orthogonal to the bit lines, and respective said second input/output ports thereof may be connected to one another through common input/output lines. Further, the plurality of the unit memory blocks may be arranged in a bit line extending direction, and respective said first input/output ports thereof may be connected to one another through common input/output lines. Furthermore, the plurality of the unit memory blocks may be arranged in a bit line extending direction and in a direction orthogonal to the bit lines, respective said first input/output ports thereof may be connected to one another through common input/output lines, and respective said second input/output ports thereof may be connected to one another through common input/output lines.

In the present invention, said first input/output port may be connected to an internal logic circuit and said second input/output port may be connected to an input/output circuit for inputting/outputting data from/to the outside. In this case, a cache memory arranged between the memory circuit and the logic circuit may be connected to said first input/output port.

As described above, according to the present invention, the first input/output port having a wide bit width and the second input/output port having a narrow bit width can be used at the same time when inputting/outputting data of the memory cell array. Thus, the first input/output port can be used for high-speed data transfer from/to the internal circuit, and the second input/output port can be used for data transfer according to a general interface from/to the outside. In this case, an extra control circuit for adjusting mismatch of the bit widths is not required so as to avoid increases in chip area and consumption current. Then, particularly when configuring a semiconductor device in which a memory and a logic circuit are mixed, effective data transfer between the memory circuit and the internal logic circuit can be achieved while maintaining a general interface from/to the outside.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

A preferred embodiment of the present invention will be described with reference to the accompanying drawings. Hereinafter, an embodiment will be described in which the present invention is applied to a semiconductor device configured by a DRAM as a semiconductor memory device mixed with a logic circuit.

Figure 1:
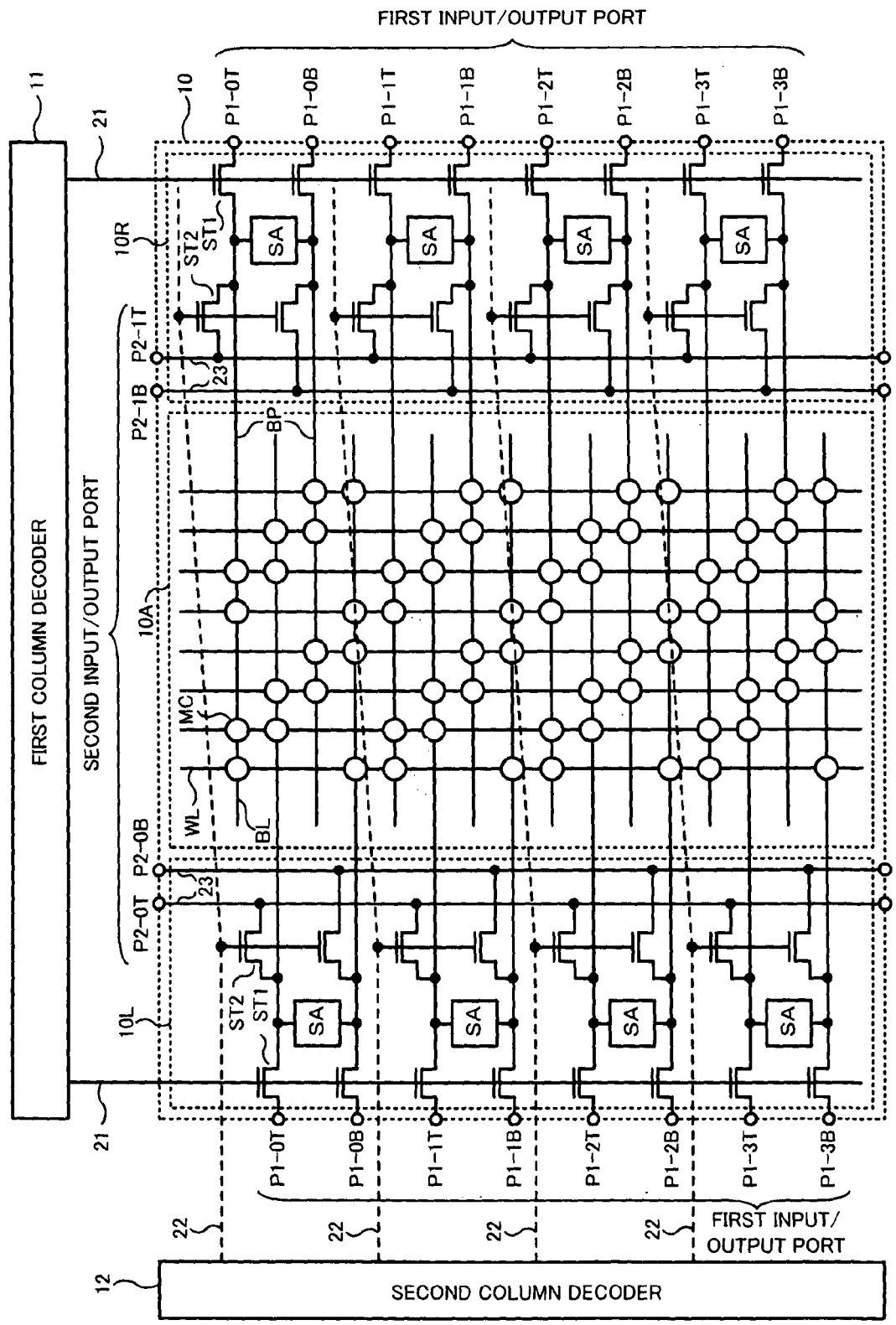
FIG. 1 is a diagram showing a principal configuration of a DRAM circuit in a semiconductor device of an embodiment.

FIG. 1 is a diagram showing a principal configuration of a DRAM circuit in the semiconductor device of the embodiment. In FIG. 1, a circuit portion is shown in which a memory block 10 composed of a memory cell array 10A and two sense amplifier/select circuit units 10L and 10R arranged on both sides thereof, a first column decoder 11 and a second column decoder 12 are included. In the following, a case of accessing the DRAM circuit for which each single memory block 10 serves as a control unit, however actually a large capacity DRAM circuit can be freely configured by arranging a large number of memory blocks 10 as described later.

In the above-described configuration, a plurality of word lines WL and a plurality of bit lines BL intersecting therewith are arranged in the memory cell array 10A, and a large number of memory cells MC are formed at intersections between the word lines WL and bit lines BL. In FIG. 1, an example of arranging 8 word lines WL and 16 bit lines BL in the memory cell array 10A is shown for the convenience of explanation, however the memory cell array 10A is actually configured by arranging a larger number of word lines WL and bit lines BL.

Two bit lines BL as a set constitute a bit line pair. As shown in FIG. 1, a single memory cell MC is formed at one of two intersections between each bit line pair BP and one word line WL. Accordingly, since there are 128 (8×16) intersections in FIG. 1, half 64 memory cells MC are formed. When m word lines WL and n bit lines BL are arranged in the memory cell array 10A, m×n/2 memory cells MC are formed so that data of m×n/2 bits in total can be stored. The arrangement pattern for the intersections of memory cells MC of FIG. 1 is an example, and thus a variety of arrangement patterns capable of storing the same data can be employed.

As shown in FIG. 1, the bit lines BL are alternately connected to the sense amplifier/select circuit unit 10L or 10R. By paying attention to the bit line pair BP, four bit line pairs BP are connected to the left side sense amplifier/select circuit unit 10L, while remaining four bit line pairs BP are connected to the right side sense amplifier/select circuit unit 10R. Each of the sense amplifier/select circuit units 10L and 10R includes two select transistors ST2, one sense amplifier SA and two select transistors ST1 from the near side of the memory cell array 10A, as constituent elements corresponding to each bit line pair BP.

The sense amplifier SA has two input terminals connected between two bit lines BL of the bit line pair BP, and operates to amplify a minute potential of the bit line pair BP generated due to accumulate charge of the memory cell MC and to rewrite it to the memory cell MC. The select transistor ST1 is inserted in each bit line BL in series, and is controlled to be on/off in response to a select control line 21 connected to the gate. Further, the select transistor ST2 is connected to each bit line BL in parallel, and is controlled to be on/off in response to a select control line 22 connected to the gate. Additionally, regarding the sense amplifier/select circuit units 10L and 10R on the both sides, the sense amplifiers SA, the select transistors ST1 and ST2 are respectively arranged symmetrically.

In the embodiment, the first column decoder 11 and the second column decoder 12 are provided as two column decoders for selecting a bit line pair BP corresponding to an input column address. As shown in FIG. 1, two select control lines 21 are output from the first column decoder 11, and extend in a direction intersecting with the respective bit lines BL (an orthogonal direction). One select control line 21 is connected to eight select transistors ST1 of the left side sense amplifier/select circuit unit 10L, and the other select control line 22 is connected to eight select transistors ST1 of the right side sense amplifier/select circuit unit 10R. In accordance with the decoded result of the column address, one select control line 21 is selectively activated and goes high, and corresponding eight select transistors ST1 turn on.

In the left side sense amplifier/select circuit unit 10L, one ends of the eight select transistors ST1 are defined as a first input/output port. The first input/output port includes a pair of terminals P1-0T and P1-0B, a pair of terminals P1-1T and P1-1B, a pair of terminals P1-2T and P1-2B, and a pair of terminals P1-3T and P1-3B, corresponding to a combination of half of the bit line pairs BP of the memory cell array 10A. When the above-mentioned select transistors ST are controlled to be on for the left side sense amplifier/select circuit unit 10L, both ends of each sense amplifier SA is connected to a pair of terminals. Four sense amplifier SA corresponding to four bit line pairs BP are connected to the first input/output port through the eight select transistors being on. Thus, the first input/output port transmits data of 4 bits in total, and its bit width is 4 bits.

Also in the right side sense amplifier/select circuit unit 10R, the same first input/output port is defined symmetrically. That is, the first input/output port including the same four pairs of terminals as for the left side sense amplifier/select circuit unit 10L is defined, corresponding to a combination of remaining half of the bit line pairs BP which are different from the above-mentioned bit line pairs of the memory cell array 10A, and is controlled by the eight select transistors ST in the same manner. In this case, the left side and right side sense amplifier/select circuit units 10L and 10R have the first input/output ports commonly connected to each other, and are capable of transferring data through common input/output lines (not shown).

In this manner, the connection relation between the first input/output port having the bit width of 4 bits and the memory cell array 10A is controlled and switched by two select control lines 21 of the first column decoder 11. Considering a case in which n bit lines BL are arranged as a general configuration of the memory cell array 10A, the first input/output port having a bit width of n/4 bits corresponding to n/2 bit line pairs BP can be controlled and switched by the same two select control lines 21. Generally, since the number of the bit lines BL arranged in the memory cell array 10A is large, the bit width of the first input/output port becomes large.

Meanwhile, as shown in FIG. 1, four select control lines 22 are output from the second column decoder 12, and respectively extend in a direction of the bit lines BL. Each select control line 22 is connected to two select transistors ST2 of the left side sense amplifier/select circuit unit 10L and to two select transistors ST2 of the right side sense amplifier/select circuit unit 10R. In accordance with the decoded result of the input column address, one of four select control lines 21 is activated and goes high, and corresponding four select transistors ST2 turn on.

As shown in FIG. 1, the select control lines 22 are represented by dotted lines, and this indicates that the select control lines 22 should be formed in a wiring layer different from that for the bit lines BL in consideration of a wiring pitch of the bit lines BL.

Respective one ends of the four select transistors ST2 connected to each select control line 22 are connected to different four input/output lines 23 extending in a direction orthogonal to the bit lines BL, and these input/output lines 23 are defined as a second input/output port. The second input/output port includes a pair of terminals P2-0T and P2-0B, and a pair of terminals P2-1T and P2-1B. In the left side sense amplifier/select circuit unit 10L, the terminal P2-0T is connected to one select transistor ST2 of the bit line pair BP, and the terminal P2-0B is connected to the other select transistor ST2 of the bit line pair BP. In the right side sense amplifier/select circuit unit 10R, the terminal P2-1T is connected to one select transistor ST2 of the bit line pair BP, and the terminal P2-1B is connected to the other select transistor ST2 of the bit line pair BP. When one select control line 22 is selected by the second column decoder 12, two bit line pairs BP are connected to the second input/output port through the four select transistors ST2, and transmit data of 2 bits in total. Therefore, the bit width of the second input/output port is 2 bits.

In this manner, the connection relation between the second input/output port having the bit width of 2 bits and the memory cell array 10A is controlled and switched by four select control lines 22 of the second column decoder 12. However, considering a case in which n bit lines BL are arranged as described above, the second input/output port is configured such that the bit width of 2 bits is maintained and n/4 select control lines 22 corresponding to n/2 bit line pairs BP are provided. That is, the bit width of the first input/output port increases as the number of the bit line pairs BP increases, while the second input/output port has a constant bit width regardless of an increase in the number of the bit line pairs BP.

For example, since the first input/output port having a wide bit width is suitable for transferring large data in a short time, this is used when transferring data between the DRAM circuit and the other logic circuit inside the semiconductor device. On the contrary, the second input/output port having a narrow bit width is used when transferring data between the semiconductor device and the outside corresponding to general DRAM interface. Thus, the configuration for separately using two types of input/output ports having different bit widths is useful for particularly applying to the logic circuit mixed DRAM.

In the embodiment, the term "port" in the first or second input/output port is used in the following meaning. That is, one or each of a plurality of terminals for inputting/outputting data (write data or read data) from/to the memory block 10 is referred to as a "port". Each "port" is controlled individually, and when the semiconductor device is configured to transmit data of a plurality of I/O (input/output) bits, the data can be input/output at the same time. The concept of the term "port" may be simply a wiring (or a node) as well as the above-mentioned terminal. As shown in FIG. 1, each terminal of the "port" is represented by a small circle.

In the embodiment, the configuration of the DRAM circuit of FIG. 1 has various modifications. In the following, six modifications corresponding to the configuration of the DRAM circuit of FIG. 1 will be described with reference to FIGS. 2 to 7. The configuration of the memory cell array 10A in FIGS. 2 to 7 is the same as that in FIG. 1, so description thereof is omitted.

Figure 2:
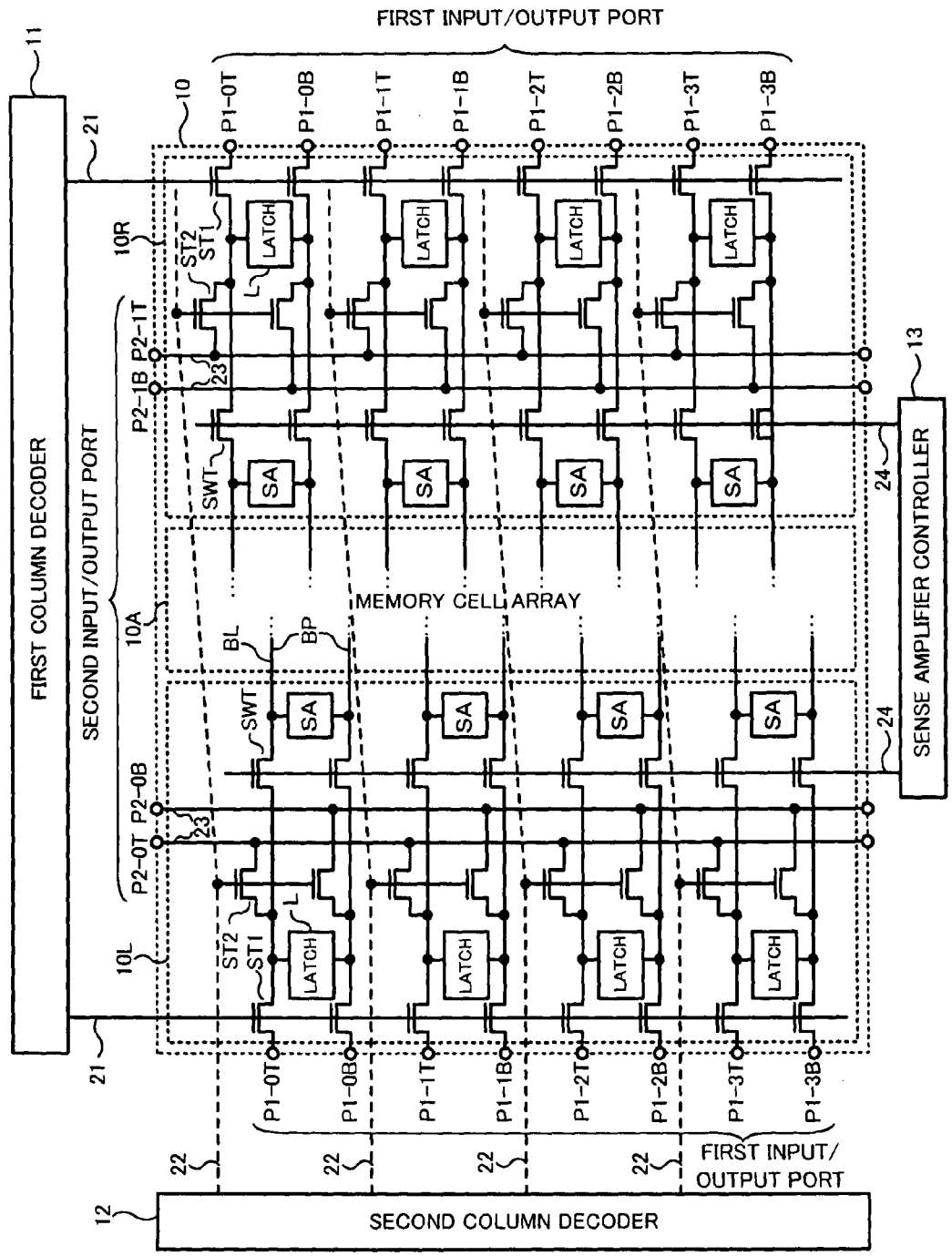
FIG. 2 is a diagram showing a principal configuration of the DRAM circuit of a first modification.

FIG. 2 is a diagram showing a principal configuration of a DRAM circuit of a first modification. In the first modification as shown in FIG. 2, two sense amplifier/select circuit units 10L are 10R are configured differently from those of in FIG. 1. There are provided one sense amplifier SA, two switch transistors SWT, two select transistors ST2, one latch circuit L and two select transistors ST1 from the near side of the memory cell array 10A, as constituent elements corresponding to each bit line pair BP. Among these elements, the sense amplifier SA and the select transistors ST1 and ST2 are the same as those of FIG. 1.

The switch transistor SWT is inserted in each bit line BL in series, and is controlled to be on/off in response to a control line 24 connected to the gate. In the first modification, a sense amplifier controller 13 is provided, which outputs two control lines 24 for controlling the sense amplifiers SA. Here, the switch transistor SWT and the sense amplifier controller 13 function as the switching means of the invention in cooperation with each other. one control line 24 is connected to the respective switch transistors SWT of the left side sense amplifier/select circuit unit 10L, and the other control line 24 is connected to the respective switch transistors SWT of the right side sense amplifier/select circuit unit 10R.

The latch circuit L is located between the select transistor ST1 and the select transistor ST2, and has two input terminals connected between two bit lines of the bit line pair BP. Data amplified by the sense amplifier SA and transferred through the bit line pair BP is stored in the latch circuit L. In each bit line pair BP of this case, when the switch transistor SWT is on, the sense amplifier SA is connected to the latch circuit L and data of the sense amplifier SA is directly transferred into the latch circuit L, while when the switch transistor SW is off, the sense amplifier SA is disconnected from the latch circuit L.

In FIG. 2, the connection relation of the first input/output port to the first column decoder 11 and the select transistors ST1, and the connection relation of the second input/output port to the second column decoder 12 and the select transistors ST2 are common to those of FIG. 1. However, the relation of positions of the select transistors ST1 and ST2 and the sense amplifiers SA are different from that of FIG. 1, and control using the latch circuit L is required, which will be described later.

It is a feature of the first modification that data of each sense amplifiers SA is not directly coupled to the first and second input/output ports, but coupled thereto through the latch circuits L. First, the amplification of the sense amplifiers SA is completed, then thereafter the switch transistors SWT connected to the two control lines 24 are controlled to be on by the sense amplifier controller 13. Thereby, data of the sense amplifier SA at this point is transferred to each latch circuit L on the same bit line pair BP. Thereafter, the switch transistors SWT are controlled to be off at a predetermined timing, and the sense amplifiers SA are disconnected from the latch circuits L. Subsequently, even if the operating state of the sense amplifiers SA is changed, the latch circuit L maintains the stored data.

When one of the select control lines 21 is switched to high by the first column decoder 11, four latch circuits L are connected to the first input/output port through eight select transistors ST1 being on. Meanwhile, when one of the select control lines 22 is switched to high by the second column decoder 12, two latch circuits L are connected to the second input/output port through four select transistors ST2 being on. In this manner, when accessing through the first or second input/output port, the latch circuit L functions as a cache memory of the sense amplifier SA. Accordingly, when data is stored in the latch circuit L, thereafter data refresh for the sense amplifier SA can be performed, so that the first modification allows operating efficiency to be improved.

Figure 3:
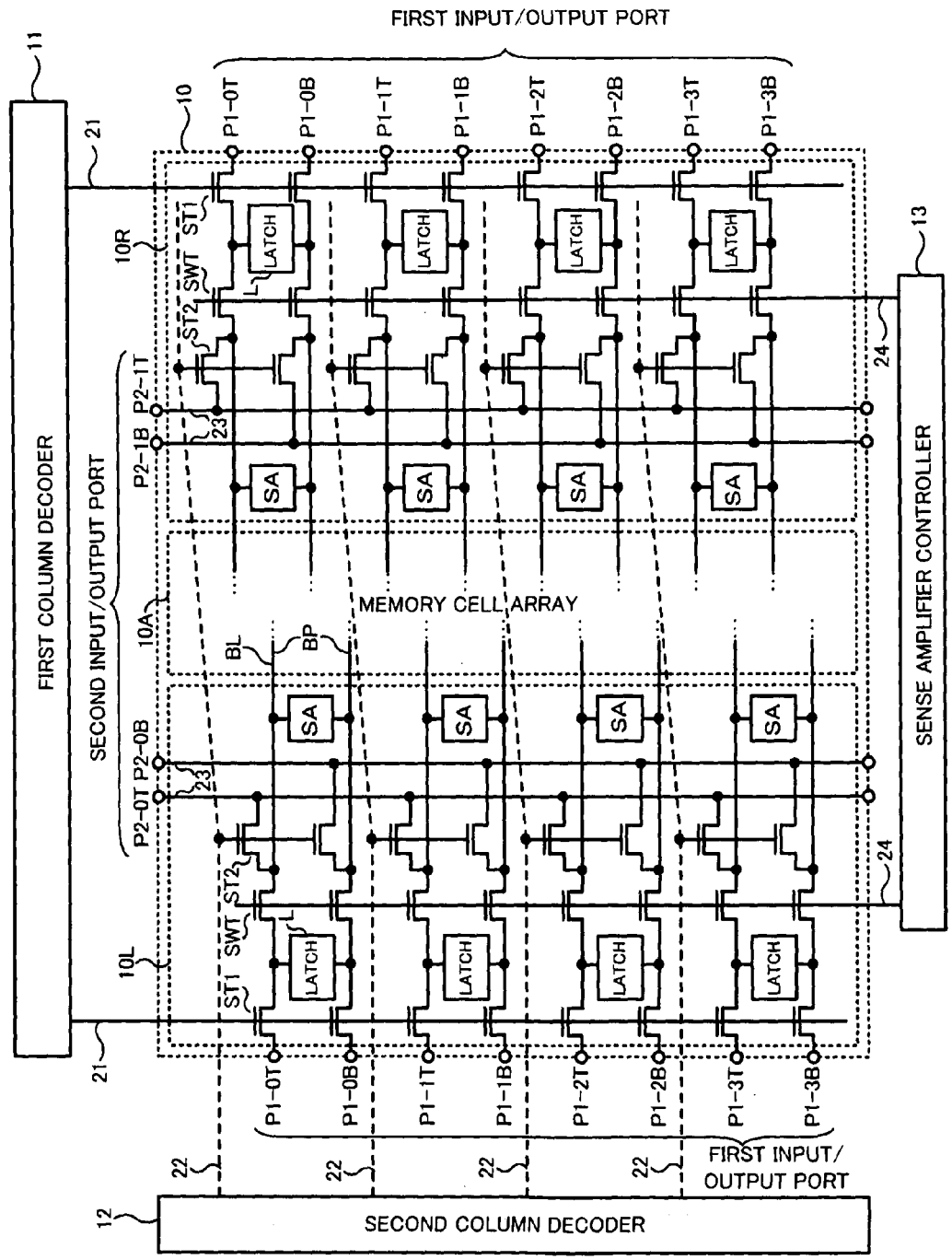
FIG. 3 is a diagram showing a principal configuration of the DRAM circuit of a second modification.

FIG. 3 is a diagram showing a principal configuration of a DRAM circuit of a second modification. In the second modification as shown in FIG. 3, in each of the two sense amplifier/select circuit units 10L and 10R, there are provided one sense amplifier SA, two select transistors ST2, two switch transistors SWT, one latch circuit L and two select transistors ST1 from the near side of the memory cell array 0A, as constituent elements corresponding to each bit line pair BP. By comparing with the first modification, it is different in that the positions of the select transistor ST2 and the switch transistor SWT are interchanged.

In the configuration of FIG. 3, when the select transistors ST1 are controlled to be on, the latch circuits L are connected to the first input/output port on each corresponding bit line pair BP, and thus operation of this case is the same as that of the first modification. On the contrary, when the select transistors ST2 are controlled to be on, the sense amplifiers SA are connected to the second input/output port on each corresponding bit line pair BP. It is a feature that the first input/output port having a wide bit width is connected through the latch circuits L, while the second input/output port having a narrow bit width is directly connected to the sense amplifiers SA. It is desirable to employ the second modification, for example, in a case in which a large amount of operation process is performed using the latch circuits L as a cache memory while external transfer is matched with the general DRAM interface. In the first and second modifications, data stored in the latch circuits L can be written to the memory cells MC by turning the switch transistors SWT on at the time of writing.

Figure 4:
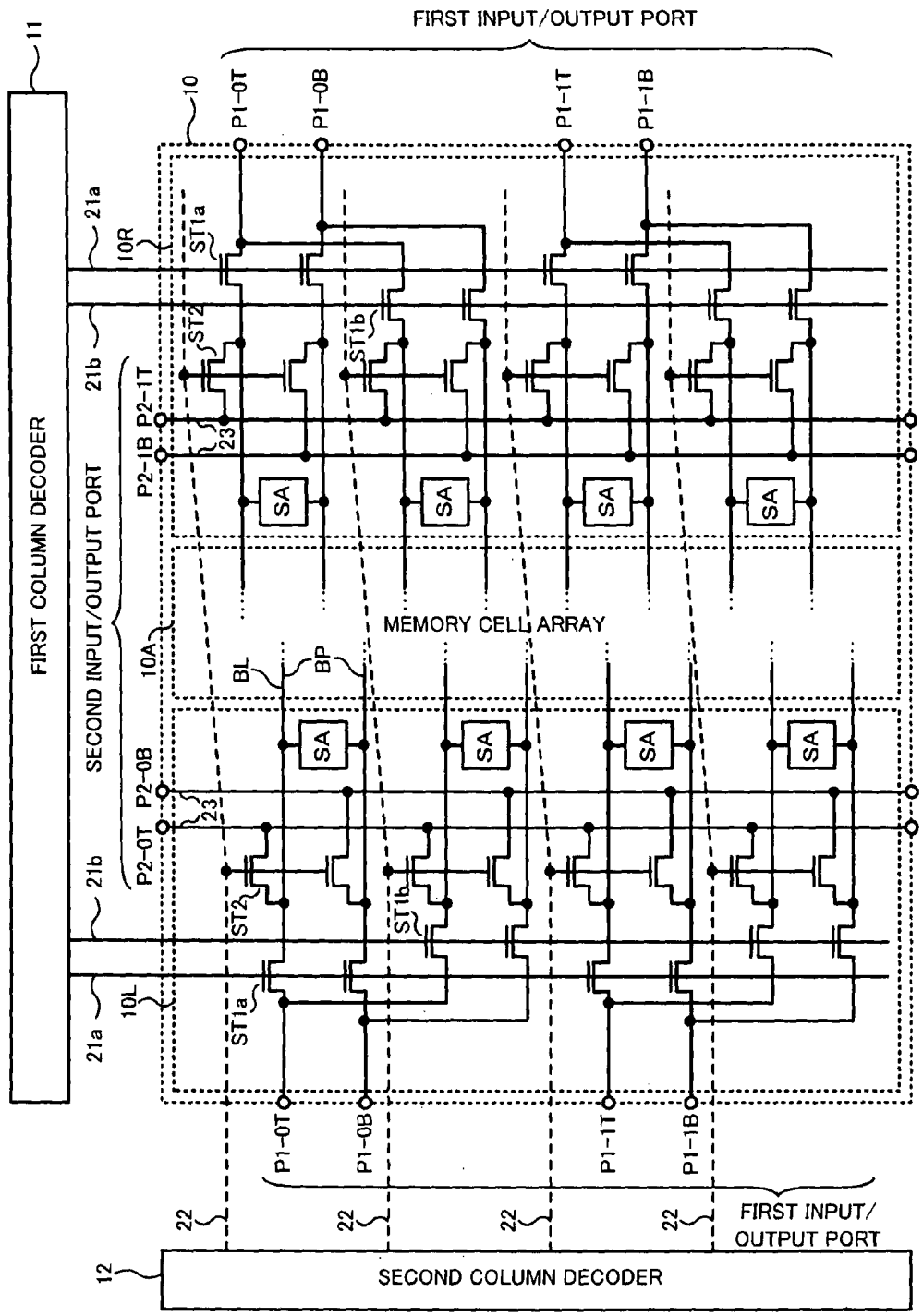
FIG. 4 is a diagram showing a principal configuration of the DRAM circuit of a third modification.

FIG. 4 is a diagram showing a principal configuration of a DRAM circuit of a third modification. In the third modification as shown in FIG. 4, in each of two the sense amplifier/select circuit units 10L and 10R, configurations corresponding to adjacent bit line pairs BP are different, which are repeated on every two bit line pairs BP. That is, one configuration in which the sense amplifier SA, two select transistors ST2 and two select transistors ST1a are arranged on one bit line pair BP, and the other configuration in which the sense amplifier SA, two select transistors ST2 and two select transistors ST1b are arranged on the other bit line pair BP, are alternately repeated. Then, the two select transistors ST1a on one bit line pair BP and the two select transistors ST1b on the other bit line pair BP are commonly connected to a corresponding bit line pair BP of the first input/output port.

The number of terminals of the first input/output port is reduced by half compared with that in FIG. 2. That is, in the left side sense amplifier/select circuit unit 10L, a pair of terminals P1-0T and P1-0B in the upper part of FIG. 4 and a pair of terminals P1-1T and P1-1B in the lower part of FIG. 4 are provided, and the same terminals are also provided in the right side sense amplifier/select circuit unit 10R.

Further, four select control lines 21a and 21b are output from the first column decoder 11. Among these, two select control lines 21a are connected to the gates of the two select transistors ST1a of the sense amplifier/select circuit units 10L and 10R on the both sides, and two select control lines 21b are connected to the gates of the two select transistors ST1b of the sense amplifier/select circuit units 10L and 10R on the both sides. In this manner, in comparison with FIG. 2, the number of the select transistors ST1a and ST1b is the same, and the number of the select control lines 21 is doubled. However, the number of terminals of the first input/output port is reduced by half. In this case, the first input/output port transmits data of 2 bits in total and its bit width is 2 bits.

In the third modification, data of two sense amplifiers SA corresponding to two bit line pairs BP can be selectively transferred to a pair of terminals of the input/output port. To achieve this purpose, either of one path through the select transistor ST1a and the other path through the select transistor ST1b can be connected to the first input/output port using the select control lines 21a and 1b controlled by the first column decoder 11. In addition, the second column decoder 12 and the second input/output port are configured in the same manner as in the second modification. In a case in which the number of control lines of the first column decoder 11 can be increased for the same memory array 10A and correspondingly the number of terminals of the first input/output port having a wide bit width is reduced, it is desirable to employ the third modification.

Figure 5:
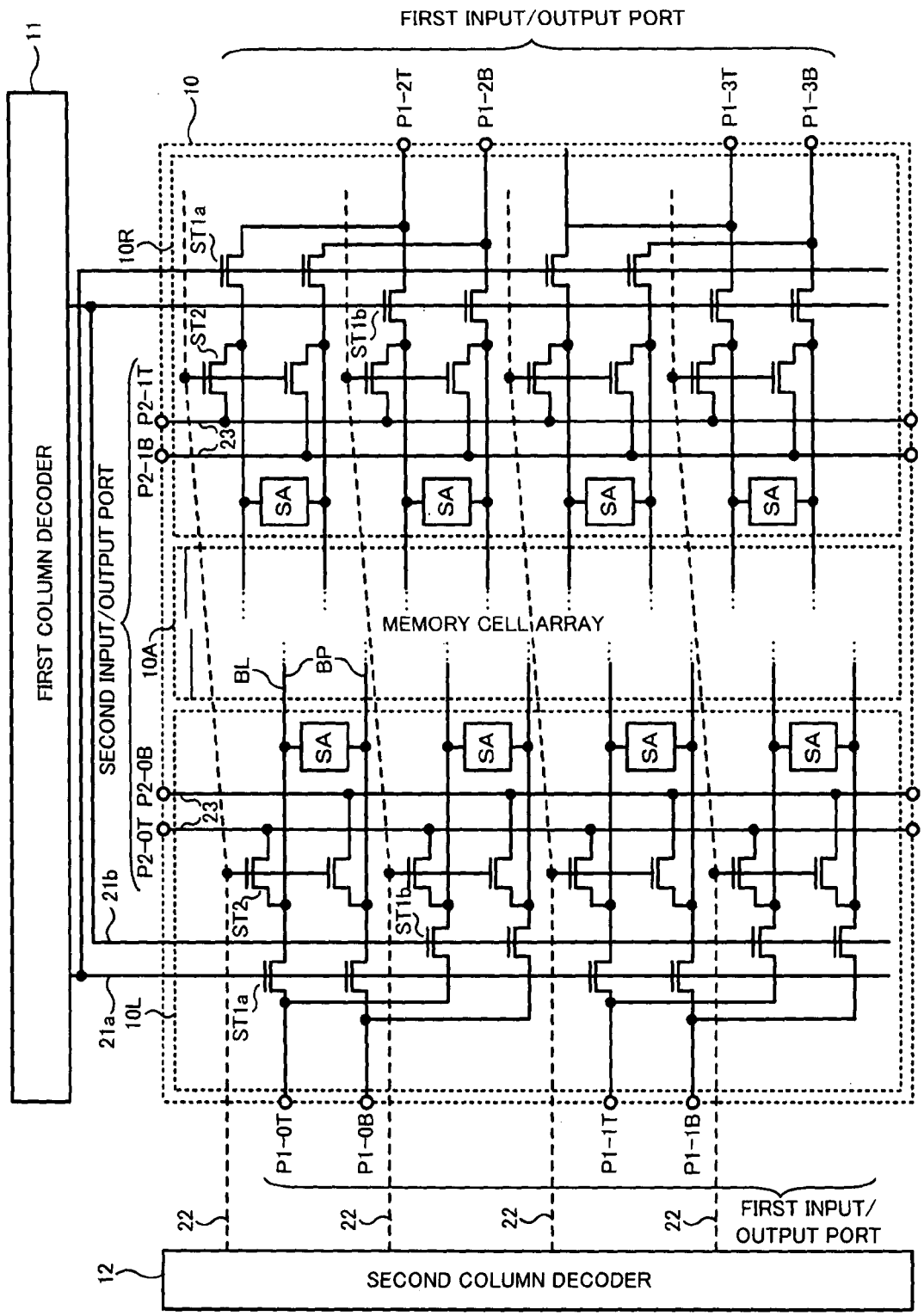
FIG. 5 is a diagram showing a principal configuration of the DRAM circuit of a fourth modification.

FIG. 5 is a diagram showing a principal configuration of a DRAM circuit of a fourth modification. The fourth modification as shown in FIG. 5 has a similar configuration to that of the third modification of FIG. 4, and the sense amplifier/select circuit units 10L and 10R on the both sides are configured in the same manner as in FIG. 4. Meanwhile, it is different from FIG. 4 in that two select control lines 21a and 21b are output from the first column decoder 11. The select control lines 21a and 21b are respectively branched halfway and connected to the select transistors ST1a and ST1b of the sense amplifier/select circuit units 10L and 10R on the both sides.

Based on such a configuration, the number of terminals of the first input/output port is doubled as compared with FIG. 4. More specifically, the first input/output port includes a pair of terminals P1-2T and P1-2B and a pair of terminals P1-3T and P1-3B in the right side sense amplifier/select circuit unit 10R, in addition to a pair of terminals P1-0T and P1-0B and a pair of terminals P1-1T and P1-1B in the left side sense amplifier/select circuit unit 10L. It is different from the configuration of FIGS. 1 to 4 in that the first input/output port is arranged extending over the sense amplifier/select circuit units 10L and 10R on the both sides.

In the fourth modification, by sharing the select control lines 21a and 21b from the first column decoder 11, the number thereof is reduced by half from four to two, while the bit width of the first input/output port is 4 bits which is twice that of the third modification. In addition, the second column decoder 12 and the second input/output port are configured in the same manner as in the second and third modifications. When the number of control lines of the first column decoder 11 is reduced while having the same arrangement as that in the third modification, it is desirable to employ the fourth modification.

Figure 6:
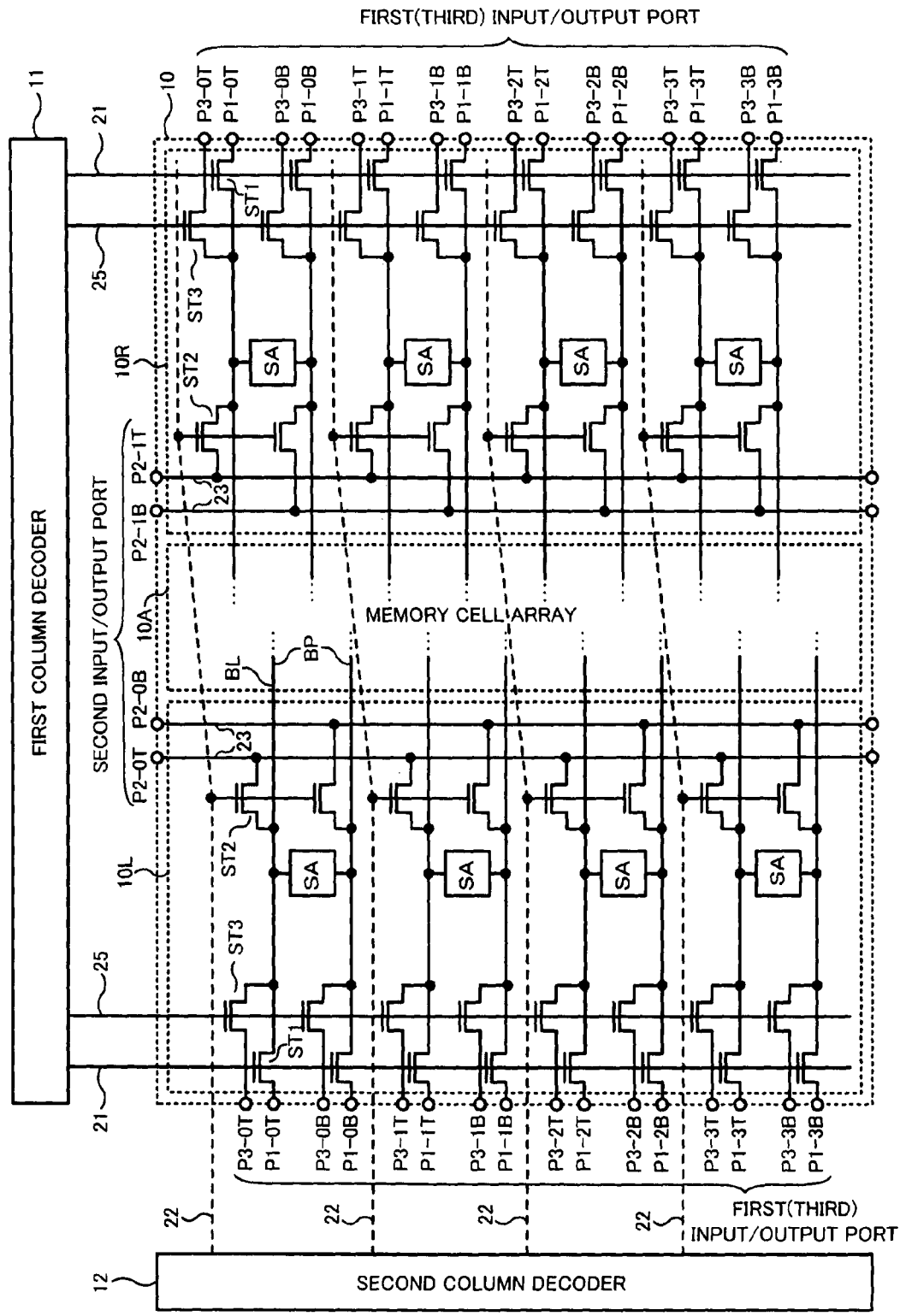
FIG. 6 is a diagram showing a principal configuration of the DRAM circuit of a fifth modification.

FIG. 6 is a diagram showing a principal configuration of a DRAM circuit of fifth modification. In the fifth modification as shown in FIG. 6, in each of two the sense amplifier/select circuit units 10L and 10R, select transistors ST3 connected at one ends to select transistors ST1 are arranged, and the other ends of the select transistors ST3 are defined as a third input/output port. The third input/output port includes a pair of terminals P3-0T and P3-0B, a pair of terminals P3-1T and P3-1B, a pair of terminals P3-2T and P3-2B and a pair of terminals P3-3T and P3-3B each corresponding to the bit line pair BP. The third input/output port including these four pairs of terminals are defined symmetrically for the sense amplifier/select circuit units 10L and 10R on the both sides as in the first input/output port Two select control lines 25 are output from the first column decoder 11 as well as the two select control lines 21. The two select control lines 21 are connected to the select transistors ST1 like in FIG. 1. Meanwhile, one of the two select control lines 25 is connected to the select transistors ST3 of the left side sense amplifier/select circuit unit 10L, and the other is connected to the select transistors ST3 of the right side sense amplifier/select circuit unit 10R.

In the fifth modification, the first and third input/output ports which are controlled by the first column decoder 11 can be selectively used. In addition, the second column decoder 12 and the second input/output port are configured in the same manner as in FIG. 1. The first and third input/output ports each having a wide bit width are provided in addition to the second input/output port having a narrow bit width, which can be used for different purposes. This configuration is effective for connecting the first and third input/output ports to two different logic circuits.

Figure 7:
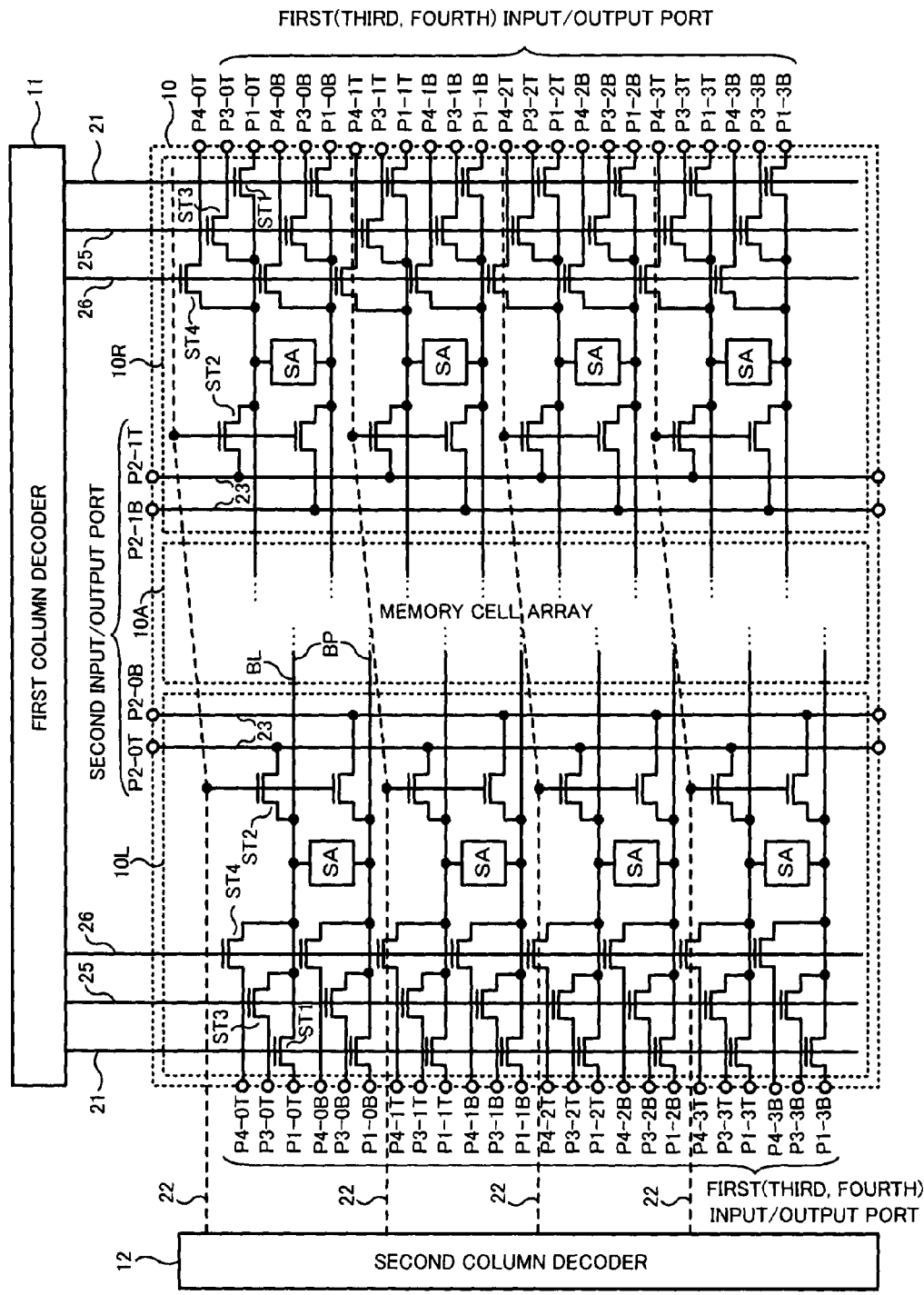
FIG. 7 is a diagram showing a principal configuration of the DRAM circuit of a sixth modification.

FIG. 7 is a diagram showing a principal configuration of a DRAM circuit of a sixth modification. In the sixth modification as shown in FIG. 7, select transistors ST4 connected at one ends to the select transistors ST1 and ST3 are further arranged in addition to the fifth modification of FIG. 6, and the other ends of the select transistors ST4 are defined as a fourth input/output port. The fourth input/output port includes a pair of terminals P4-0T and P4-0B, a pair of terminals P4-1T and P4-1B, a pair of terminals P4-2T and P4-2B, and a pair of terminals P4-3T and P4-3B each corresponding to the bit line pair BP. The fourth input/output port including these four pairs of terminals are defined symmetrically for the sense amplifier/select circuit units 10L and 10R on the both sides like in the first and third input/output ports.

Two select control lines 26 are output from the first column decoder 11 as well as the two select control lines 21 and the two select control lines 25. The select control lines 21 and 25 are connected in the same manner as FIG. 6. Meanwhile, one of the two select control lines 26 is connected to the select transistors ST4 of the left side sense amplifier/select circuit unit 10L, and the other is connected to the select transistors ST4 of the right side sense amplifier/select circuit unit 10R.

In the sixth modification, the first, third and fourth input/output ports which are controlled by the first column decoder 11 can be selectively used. In addition, the second column decoder 12 and the second input/output port are configured in the same manner as in FIG. 1. The first, third and fourth input/output ports each having a wide bit width, which are based on the fifth modification, can be used for different purposes. In this case, a configuration can be realized further based on the sixth modification, in which the first, third to N-th input/output ports each having a wide bit width are provided in addition to the second input/output port, so that an arrangement with multiple N input/output ports in total can be configured.

Although the above described DRAM circuits include only one memory block 10 as a basic unit, a large capacity DRAM macro circuit can be configured by arranging a large number of memory blocks 10. When configuring the DRAM macro circuit by arranging a plurality of memory blocks 10, a case of arranging the memory blocks 10 in a lateral direction (bit line extending direction) and a case of arranging the memory blocks 10 in a longitudinal direction (bit line orthogonal direction) are assumed, and a case of combining both the cases is also assumed, which will be respectively described in the following with reference to FIGS. 8 to 10.

Figure 8:
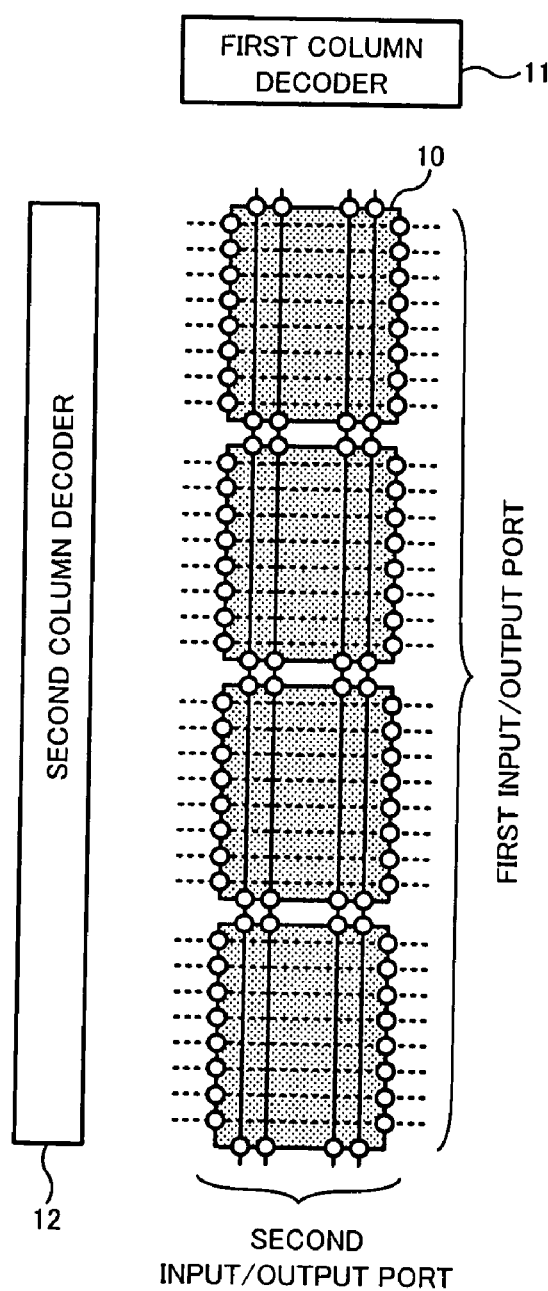
FIG. 8 is a diagram showing an example of a DRAM macro circuit including four memory blocks 10 arranged in a longitudinal direction.

FIG. 8 shows an example of a DRAM macro circuit including four memory blocks 10 arranged in a longitudinal direction. The first and second input/output ports are represented in FIG. 8 for each memory block 10 shown in FIG. 1. Further, longitudinal solid lines represent the input/output lines 23 (see FIG. 1) of the second input/output port, and lateral dotted lines represent input/output lines of the first input/output port (outside the memory array 10A). Other constituent elements are omitted in FIG. 8. Besides, the first column decoder 11 and the second column decoder 12 are arranged on the periphery of the four memory blocks 10.

As shown in FIG. 8, the four memory blocks 10 arranged in the longitudinal direction include the input/output lines 23 commonly connected to one another. Thereby, the first input/output port has a bit width of 16 bits which integrally includes the respective ports of the four memory blocks 10, while the second input/output port has a bit width of 2 bits as in one memory block 10. Further, the number of the select control lines 21 (not shown) of the first column decoder 11 is two as in FIG. 1 since they are commonly connected to the four memory blocks 10, while the number of the select control lines 22 (not shown) of the second column decoder 12 is 16, which is four times that in FIG. 1.

Figure 9:
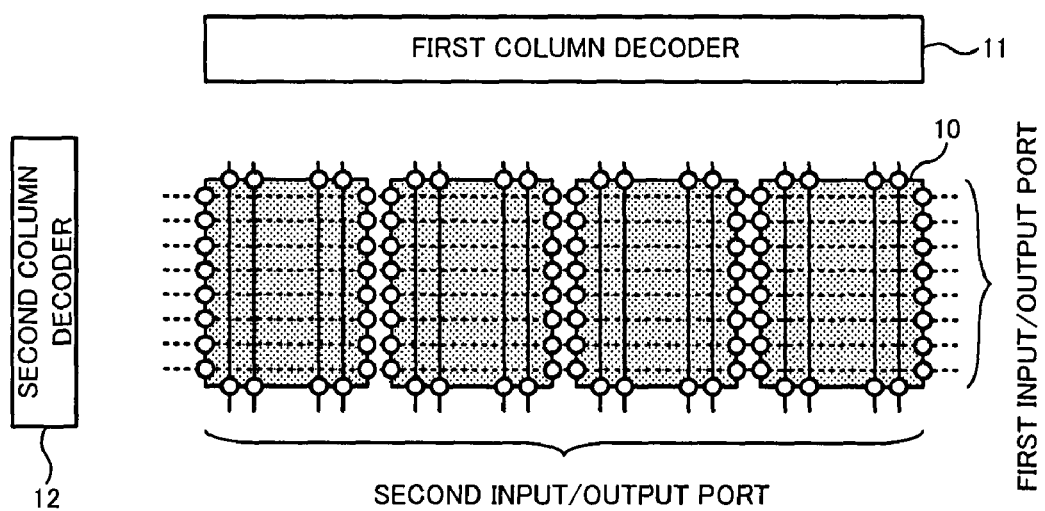
FIG. 9 is a diagram showing an example of a DRAM macro circuit including four memory blocks 10 arranged in a lateral direction.

FIG. 9 shows an example of a DRAM macro circuit including four memory blocks 10 arranged in a lateral direction. In FIG. 9, the same elements as in FIG. 8 are also represented for each memory block 10 shown in FIG. 1, and the first column decoder 11 and the second column decoder 12 arranged on the periphery thereof are shown.

As shown in FIG. 9, the four memory blocks 10 arranged in the lateral direction include input/output lines, which are commonly connected to one another, of the first input/output port. Thereby, the first input/output port has a bit width of 4 bits as in one memory block 10, while the second input/output port has a bit width of 8 bits which integrally includes the respective ports of the four memory blocks 10. Further, the number of the select control lines 21 (not shown) of the first column decoder 11 is eight, which is four times that in FIG. 2, while the select control lines 22 (not shown) of the second column decoder 12 is four as in FIG. 4 since they are commonly connected to the four memory blocks 10.

Figure 10:
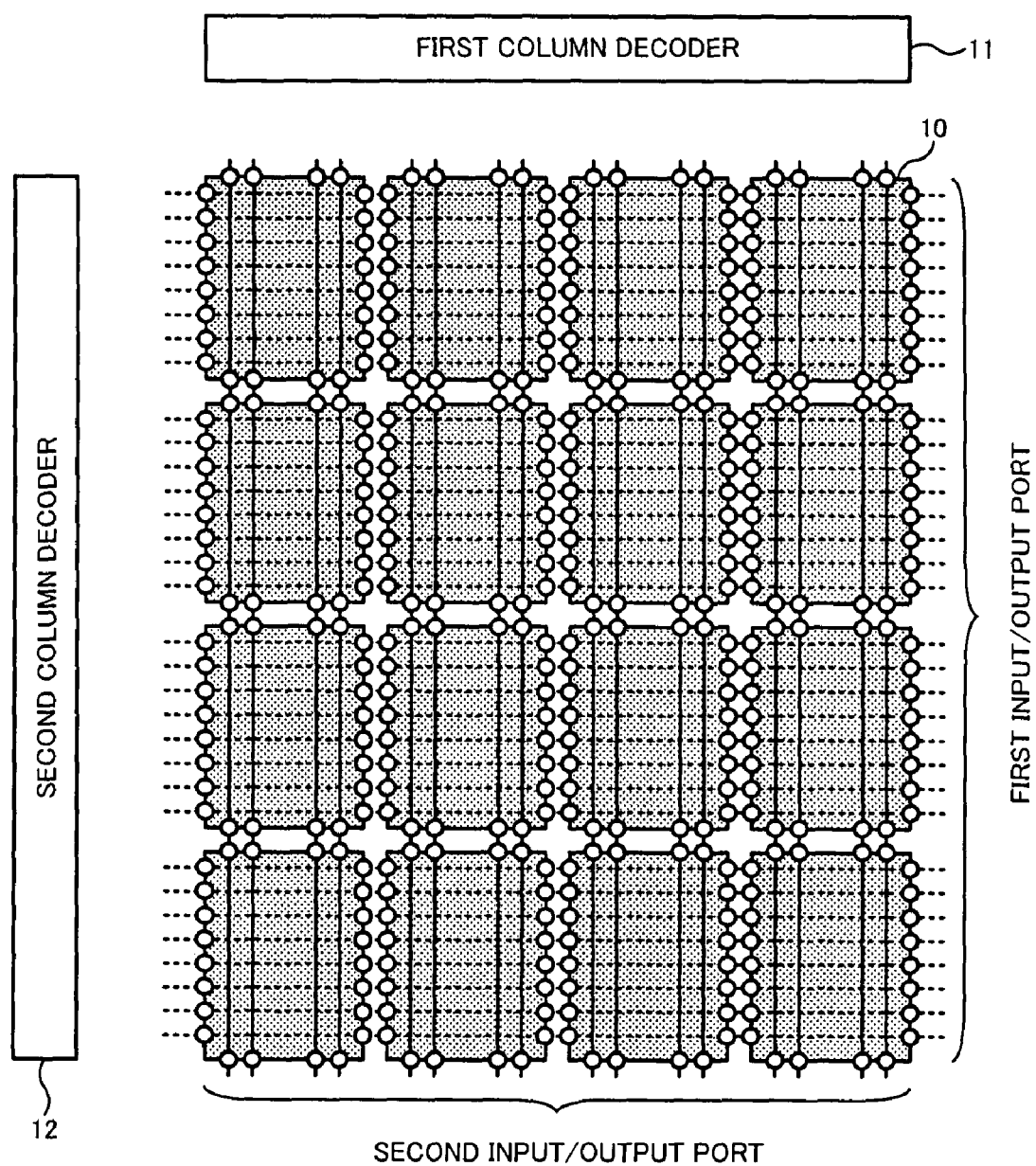
FIG. 10 is a diagram showing an example of a DRAM macro circuit including sixteen memory blocks 10 arranged in longitudinal and lateral directions.

FIG. 10 shows an example of a DRAM macro circuit including sixteen memory blocks 10 arranged in longitudinal and lateral directions. In FIG. 10, the same elements as in FIGS. 8 and 9 are also represented for each memory block 10 shown in FIG. 1, and the first column decoder 11 and the second column decoder 12 arranged on the periphery thereof are shown.

As shown in FIG. 10, the arrangement in the longitudinal direction is common to that in FIG. 8, while the arrangement in the lateral direction is common to that in FIG. 9. Therefore, the first input/output port has a bit width of 16 bits, and the second input/output port has a bit width of 8 bits. Further, the number of the select control lines 21 (not shown) of the first column decoder 11 is eight, while the number of the select control lines 22 (not shown) of the second column decoder 12 is sixteen.

Figure 11:
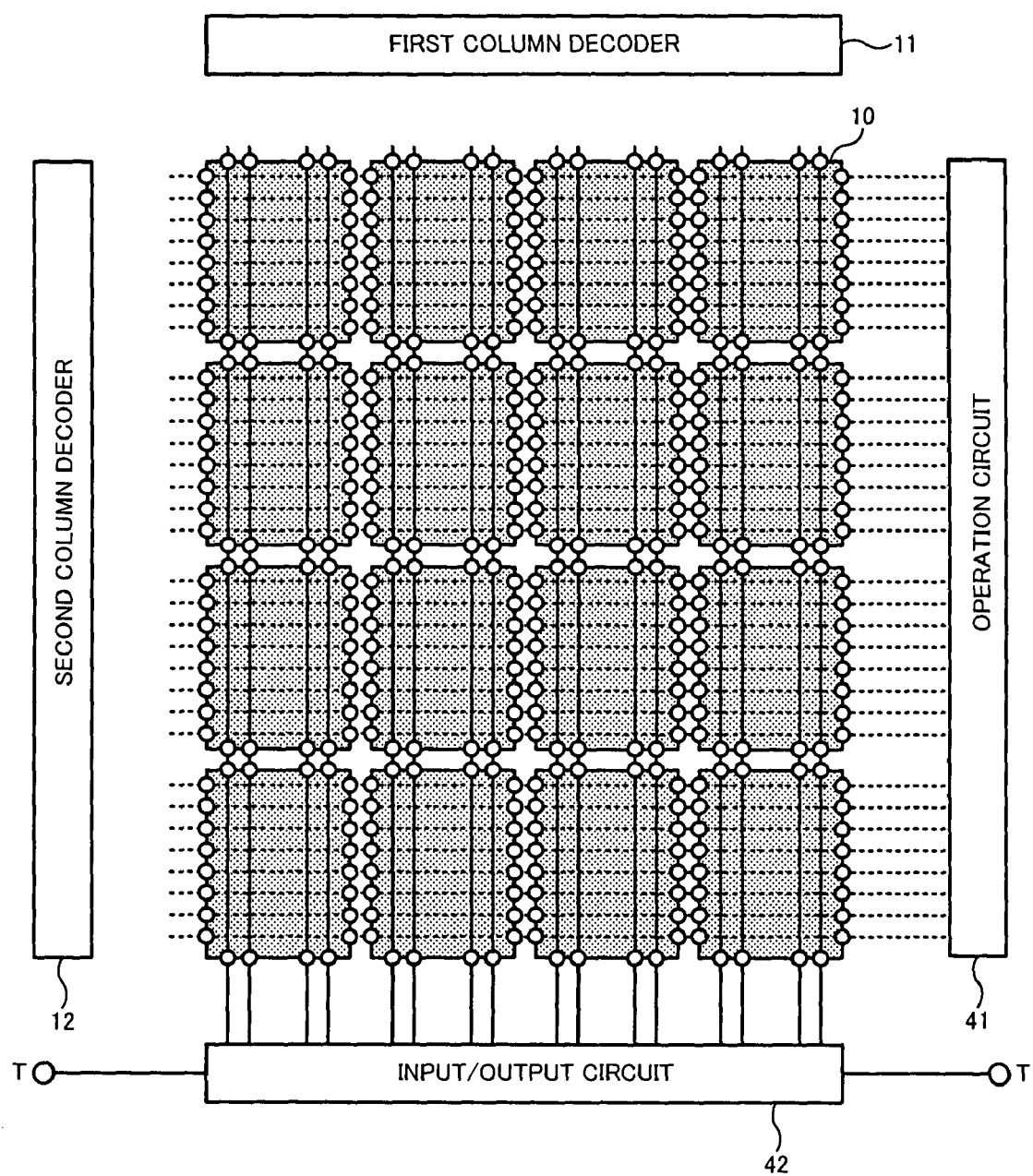
FIG. 11 is a diagram showing a modification in which an operation circuit and an input/output circuit are added to the DRAM macro circuit.

Next, a modification will be described in which additional circuits (except DRAM circuit) are provided based on the DRAM macro circuit of FIG. 10. FIG. 11 shows the modification in which an operation circuit 41 and an input/output circuit 42 are added to the DRAM macro circuit of FIG. 10. As shown in FIG. 11, the operation circuit 41 is connected to the first input/output port having a bit width of 16 bits, and the input/output circuit 42 is connected to the other end of the second input/output port having a bit width of 8 bits. Further, two input/output terminals T for inputting/outputting data between the input/output circuit 42 and the outside are provided.

The operation circuit 41 performs a predetermined operation process using data captured from the first input/output port. The bit width of the first input/output port increases according to the number of the bit lines BL so as to be suitable for a high-speed operation process using large capacity data such as image processing. Meanwhile, the input/output circuit 42 controls data input/output from/to the outside through the terminals T. In this case, the bit width of the second input/output port is determined in accordance with a specification of the general DRAM interface.

Figure 12:
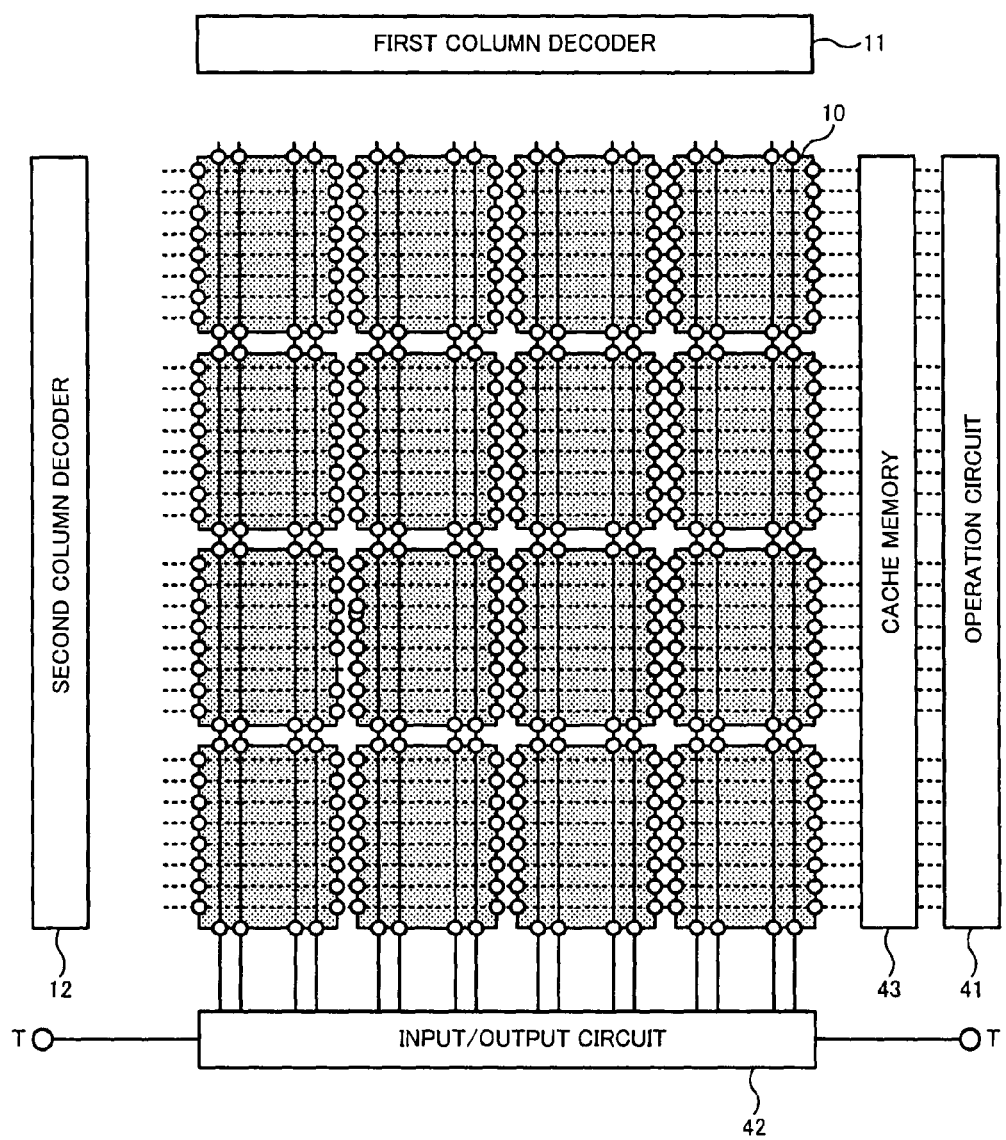
FIG. 12 is a diagram showing a modification in which a cache memory is further added to the DRAM macro circuit.

FIG. 12 shows the modification in which a cache memory 43 is further added to the DRAM macro circuit of FIG. 11. As shown in FIG. 12, the cache memory 43 is connected between the sixteen memory blocks 10 and the operation circuit 41 in the first input/output port. The Operation process of the operation circuit 41 is performed using data transferred from the memory block 10 to the cache memory 43, and data corresponding to an operation result can be written back from the cache memory 43 to the memory block 10. Thus, the memory block 10 can be used for other purposes after data is transferred to the cache memory 43, so that the operation efficiency can be improved.

Figure 13:
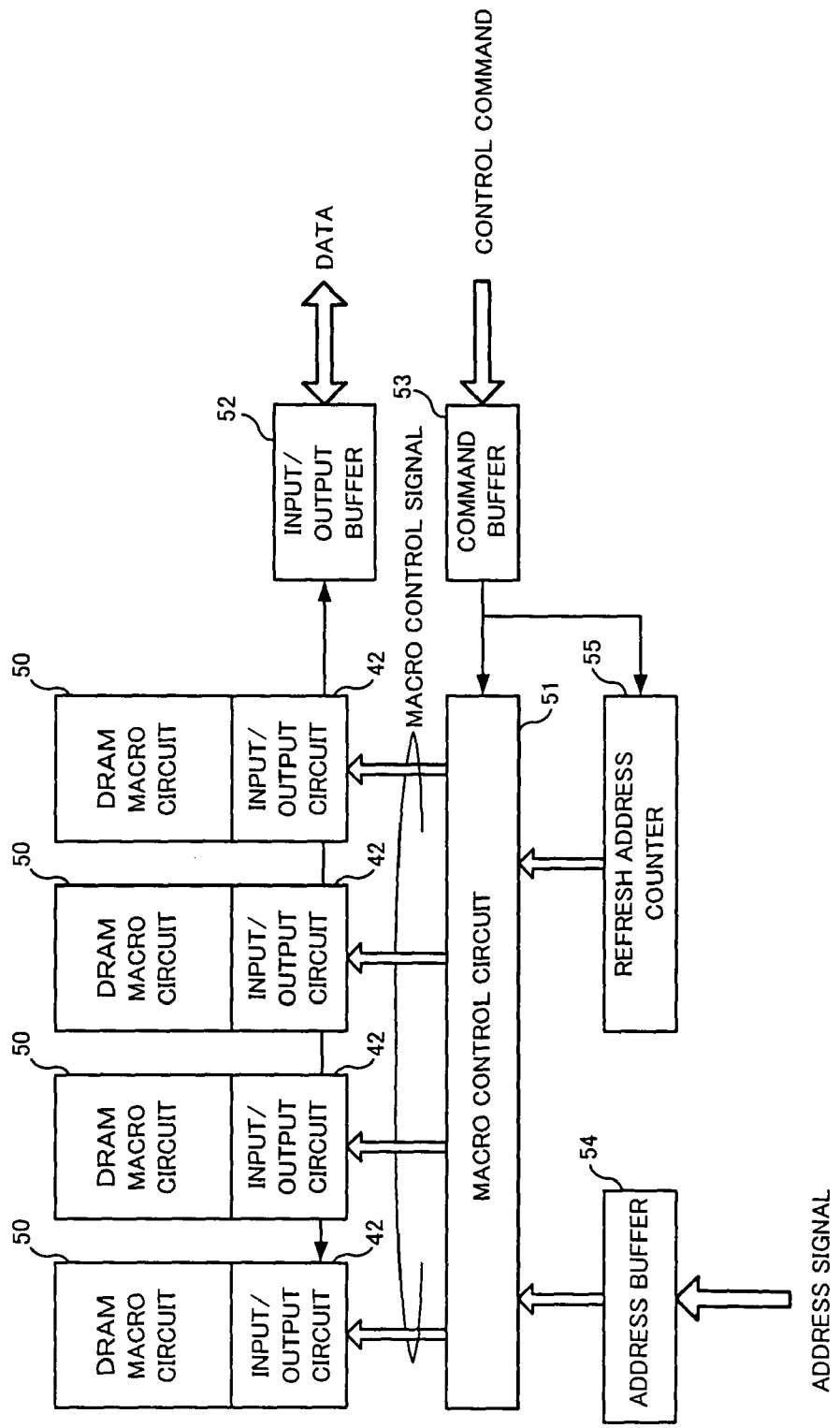
FIG. 13 is a diagram showing an example of an entire configuration of the semiconductor device of the embodiment.

FIG. 13 is a diagram showing an example of an entire configuration of the semiconductor device of the embodiment. The configuration of the embodiment is particularly effective for a logic circuit mixed DRAM, and thus the semiconductor device including the DRAM macro circuit of FIG. 11 or 12 as a basic unit will be described. The semiconductor device as shown in FIG. 13 includes four DRAM macro circuits 50 as the basic unit, the input/output circuits 42 attached to the respective DRAM macro circuits 50, a macro control circuit 51, an input/output buffer 52, a command buffer 53, an address buffer 54 and a refresh address counter 55, and is entirely configured on the same chip.

In FIG. 13, each of the four DRAM macro circuits 50 has the configuration of FIG. 11 or 12, and the entire operation thereof is controlled by the macro control circuit 51. Four input/output circuits 42 attached to the four DRAM macro circuits 50 are commonly connected to the first input/output port, and are connected to the input/output buffer 52. data is input/output between the semiconductor device and the outside through the input/output buffer 52. Further, a control command input from the outside are stored in the command buffer 53, and a macro control signal corresponding to the control command is output by the macro control circuit 51. An address signal input from the outside is stored in the address buffer 54 and sent to the macro control circuit 51. In this case, data attached to the address signal includes data for selecting the four DRAM macro circuits 50 in addition to the row address and the column address. Meanwhile, when a refresh command is input, a refresh address is counted by the refresh address counter 55.

Figure 14A:
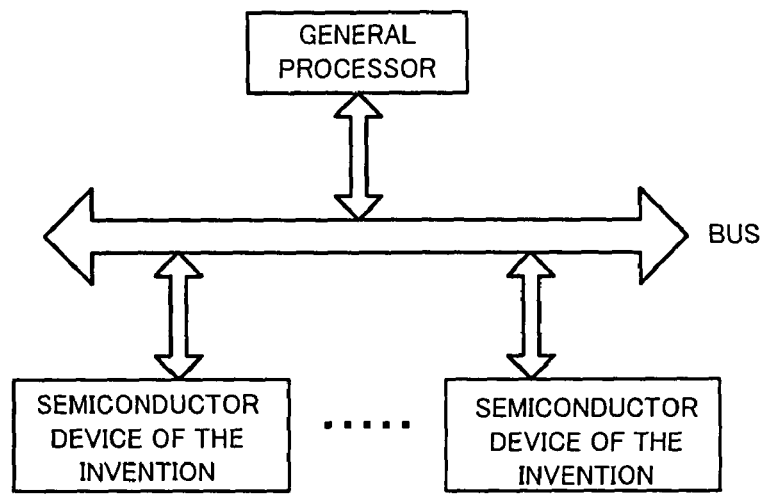
FIGS. 14A and 14B are diagrams for describing an example of a system using the semiconductor device of the invention in comparison with a conventional configuration.
Figure 14B:
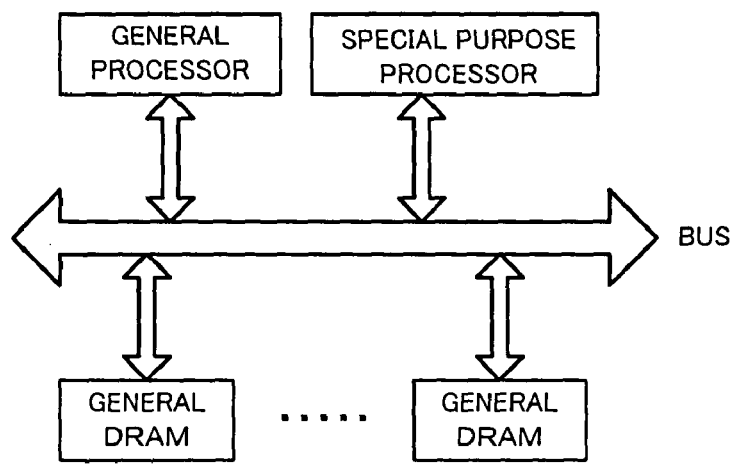
Figure 15:
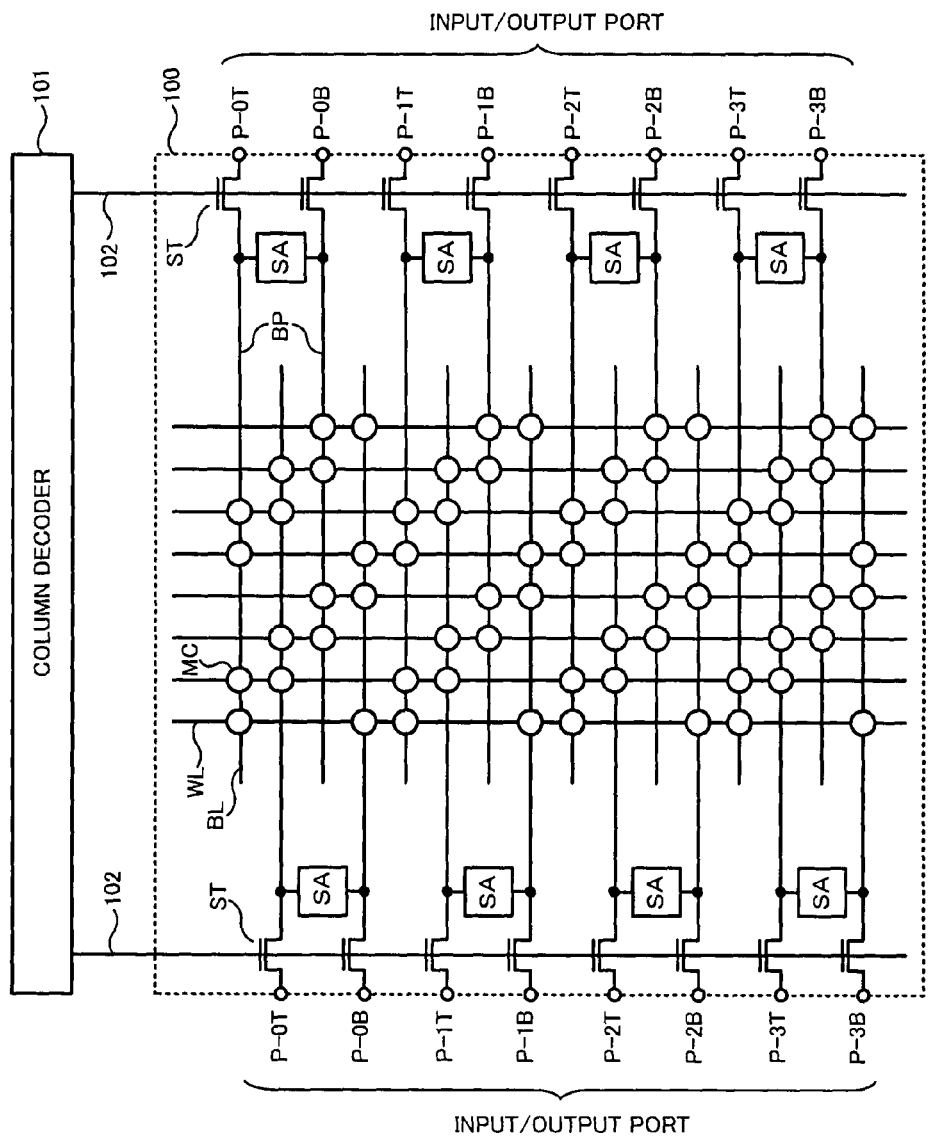
FIG. 15 is a diagram showing a specific example of a conventional DRAM circuit including a wide bit width input/output port.
Figure 16:
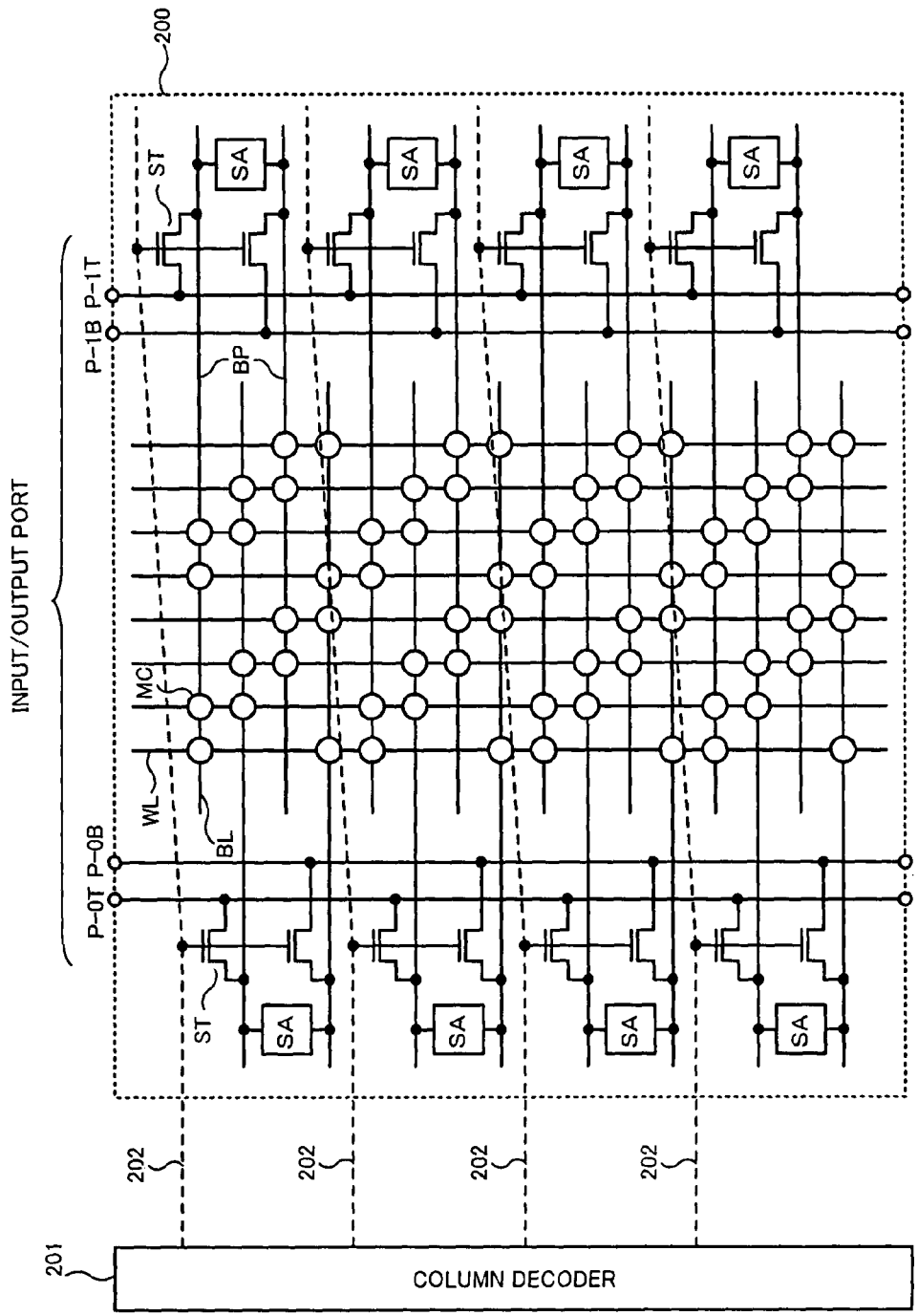
FIG. 16 is a diagram showing a specific example of a conventional DRAM circuit including a narrow bit width input/output port.

By employing the configuration of the embodiment as described above, the first input/output port having a wide bit width and the second input/output port having a narrow bit width can be used at the same time, and which can be used separately. By implementing such a semiconductor device in a system, advantages in both performance and cost can be obtained. An example of a system using the semiconductor device of the invention will be described with reference to FIGS. 14A and 14B. FIG. 14A shows an example of the system using the semiconductor device of the invention, and FIG. 14B shows an example of a system using the conventional general DRAM for comparison with the semiconductor device of the invention.

In the system of FIG. 14A, a plurality of the semiconductor devices of the invention and one general processor are connected to a bus. In this case, data transfer on the bus is performed between the plurality of the semiconductor devices and the general processor through the second input/output ports, while inside the semiconductor devices, high-speed data transfer from/to the logic circuit is performed through the first input/output ports. On the other hand, in the system of FIG. 14B, one special purpose processor serving as the above-mentioned logic circuit is connected to the bus as well as a plurality of general DRAMs and one general processor. Thus, since data transfer between each general DRAM and the special purpose processor, which is performed from/to the internal logic circuit in the configuration of FIG. 14A, is required to be performed through an external bus, bus bottleneck occurs in the configuration of FIG. 14B. Accordingly, employment of high-speed bus and implementation of a high-performance special purpose processor are required, and increases in consumption current and cost cannot be avoided. On the contrary, high-speed bus and high-performance special purpose processor is not required in the configuration of FIG. 14A, and therefore reductions in consumption current and cost can be achieved in comparison with FIG. 14B.

In the foregoing, the present invention is specifically described based on the embodiment. However, the present invention is not limited to the above described embodiment, and can be variously modified without departing the essentials of the present invention. Although a case in which the present invention is applied to a semiconductor device including a DRAM circuit is described in the embodiment, the present invention is not limited to this case and can be widely applied to a semiconductor device having the memory circuit of the present invention, or a semiconductor device in which the memory circuit of the present invention and a logic circuit are mixed.

The present invention is not limited to the above described embodiments, and various variations and modifications may be possible without departing from the scope of the present invention.

This application is based on the Japanese Patent applications No. 2006-255075 filed on Sep. 20, 2006, entire content of which is expressly incorporated by reference herein.

What is claimed is:

1. A semiconductor device, comprising:
a memory cell array including a plurality of memory cells formed at intersections between a plurality of word lines and a plurality of bit lines, the plurality of word lines extending in a first direction in parallel to one another, the plurality of bit lines extending in a second direction in parallel to one another, the first direction intersecting the second direction, the memory cell array being defined by a plurality of sides, said plurality of sides including a first side parallel to the word lines, a second side parallel to the bit lines, a third side being opposed to the first side, and a fourth side being opposed to the second side;
a first input/output port defined for inputting/outputting data to/from the memory cell array, the first input/output port being arranged on the first side and the third side of the memory cell array;
a second input/output port defined for inputting/outputting data to/from the memory cell array, the second input/output port being arranged on the second side of the memory cell array;
a plurality of sense amplifiers to amplify data of the memory cells through the plurality of bit lines;
a first select circuit which is controlled to be on/off by one or more first select control lines each extending in the first direction, the first select circuit being connected between the plurality of sense amplifiers and the first input/output port and provided along the first side of the memory cell array;
a second select circuit which is controlled to be on/off by one or more second select control lines each extending in the second direction, the second select circuit being connected between the plurality of sense amplifiers and the second input/output port and provided along the first side of the memory cell array;
a first column decoder to selectively activate the one or more first select control lines in response to an input column address, the first column decoder being arranged along the second side of the memory cell array; and
a second column decoder to selectively activate the one or more second select control lines in response to the input column address, the second column decoder being arranged along the first side of the memory cell array, and
wherein each of a plurality of bit lines is directly connected to a corresponding sense amplifier, a corresponding first select circuit, and a corresponding second select circuit.

2. The semiconductor device according to claim 1, wherein the first input/output port is connected to an internal circuit, and the second input/output port is connected to an external circuit.

3. The semiconductor device according to claim 1, wherein two bit lines as a complementary pair constitute a bit line pair, the memory cell is formed at one of two intersections between the bit line pair and the word line, and each of the sense amplifiers is arranged corresponding to the bit line pair.

4. The semiconductor device according to claim 3, wherein both the first and second input/output ports have a plurality of terminals and two of the terminals corresponding to the bit line pair transmit one bit.

5. The semiconductor device according to claim 4, wherein each of the second select control lines is arranged corresponding to the bit line pair and the second column decoder selectively activates the second select control lines a number of which is the same as a number of the bit lines.

6. The semiconductor device according to claim 4, wherein the plurality of sense amplifiers, the first select circuit and the second select circuit are symmetrically arranged at both ends in a bit line extending direction.

7. The semiconductor device according to claim 6, wherein the first select circuit is controlled to be on/off by the first select control lines different from each other at both ends in the bit line extending direction, and the first input/output port is defined at both ends in the bit line extending direction.

8. The semiconductor device according to claim 6, wherein the first select circuit is controlled to be on/off by common first select control lines at both ends in the bit line extending direction, and half of the terminals of the first input/output port are respectively defined at both ends in the bit line extending direction separately.

9. The semiconductor device according to claim 4, wherein the first select circuit includes a plurality of select transistors each of which is connected at an end to one bit line on a side of the sense amplifier and is connected at an other end to one terminal of the first input/output port.

10. The semiconductor device according to claim 4, wherein the second select circuit includes a plurality of select transistors each of which is connected at an end to one bit line on a side of the sense amplifier and is connected at an other end to one terminal of the second input/output port.

11. The semiconductor device according to claim 1, wherein a plurality of latch circuits, each to store data amplified by the sense amplifier, is provided between the plurality of sense amplifiers and the first select circuit.

12. The semiconductor device according to claim 11, further comprising switching means for switchingly controlling a connection state between the plurality of latch circuits and the plurality of sense amplifiers.

13. The semiconductor device according to claim 12, wherein the switching means includes a plurality of switch transistors arranged between the plurality of sense amplifiers and the second select circuit.

14. The semiconductor device according to claim 12, wherein the switching means includes a plurality of switch transistors arranged between the second select circuit and the plurality of latch circuits.

15. The semiconductor device according to claim 4, wherein respective terminals of the first input/output port are commonly connected to the sense amplifiers adjacent to one another in an arranging direction of the bit lines, and the first select circuit is controlled to be on/off by the first select control lines different from one another corresponding to respective sense amplifiers.

16. The semiconductor device according to claim 1, further comprising third to N-th input/output ports having a same bit width as the first input/output port which are defined for inputting/outputting data of the memory cell array,
wherein the first select circuit is connected between the plurality of sense amplifiers and the first, and third to N-th input/output ports, and is controlled to be on/off by the first select control lines different from one another.

17. The semiconductor device according to claim 1, wherein a unit memory block includes the plurality of sense amplifiers, the first select circuit and the second select circuit, and a memory circuit is configured by arranging the first column decoder and the second column decoder for a plurality of the unit memory blocks.

18. The semiconductor device according to claim 17, wherein the plurality of the unit memory blocks is arranged in a direction orthogonal to the bit lines, and respective the second input/output ports thereof are connected to one another through common input/output lines.

19. The semiconductor device according to claim 17, wherein the plurality of the unit memory blocks is arranged in a bit line extending direction, and respective the first input/output ports thereof are connected to one another through common input/output lines.

20. The semiconductor device according to claim 17, wherein the plurality of the unit memory blocks is arranged in a bit line extending direction and in a direction orthogonal to the bit lines, respective the first input/output ports thereof are connected to one another through common input/output lines, and respective the second input/output ports thereof are connected to one another through common input/output lines.

21. The semiconductor device according to claim 17, wherein the first input/output port is connected to an internal logic circuit and the second input/output port is connected to an input/output circuit for inputting/outputting data from/to an outside.

22. The semiconductor device according to claim 21, wherein a cache memory arranged between the memory circuit and the logic circuit is connected to the first input/output port.

23. The semiconductor device according to claim 1, wherein the bit lines are alternately connected to the first select circuit and the second select circuit.

24. The semiconductor device according to claim 9, wherein respective gates of the plurality of select transistors are connected to the one or more first select control lines.

25. The semiconductor device according to claim 10, wherein respective gates of the plurality of select transistors are connected to the one or more second select control lines.

26. The semiconductor device according to claim 1, wherein each of the plurality of first select circuits being arranged on said first side and third side, is connected to a corresponding different bit line, and is connected to said first input/output port on the first side and said first input/output port on the third side.

27. A semiconductor device, comprising:
a memory cell array including a plurality of memory cells formed at intersections between a plurality of word lines and a plurality of bit lines, the plurality of word lines extending in a first direction in parallel to one another, the plurality of bit lines extending in a second direction in parallel to one another, the first direction intersecting the second direction, the memory cell array being defined by a plurality of sides, said plurality of sides including a first side parallel to the word lines, a second side parallel to the bit lines, a third side being opposed to the first side, and a fourth side being opposed to the second side;
a first input/output port having a first bit width defined for inputting/outputting data to/from the memory cell array, the first input/output port being arranged on the first side and the third side of the memory cell array;
a second input/output port having a second bit width defined for inputting/outputting data to/from the memory cell array, the second input/output port being arranged on the second side of the memory cell array;
a plurality of sense amplifiers to amplify data of the memory cells through the plurality of bit lines;
a first select circuit which is controlled to be on/off by one or more first select control lines each extending in the first direction, the first select circuit being connected between the plurality of sense amplifiers and the first input/output port and provided along the first side of the memory cell array;
a second select circuit which is controlled to be on/off by one or more second select control lines each extending in the second direction, the second select circuit being connected between the plurality of sense amplifiers and the second input/output port and provided along the first side of the memory cell array;
a first column decoder to selectively activate the first select control lines in response to an input column address, the first column decoder being arranged along the second side of the memory cell array; and
a second column decoder to selectively activate the second select control lines in response to the input column address, the second column decoder being arranged along the first side of the memory cell array,
wherein the first bit width is larger than the second bit width,
wherein each of a plurality of bit lines is directly connected to a corresponding sense amplifier, a corresponding first select circuit, and a corresponding second select circuit.

28. The semiconductor device according to claim 27, wherein each of the plurality of first select circuits being arranged on said first side and third side, is connected to a corresponding different bit line, and is connected to said first input/output port on the first side and said first input/output port on the third side.

29. A semiconductor device, comprising:
a memory cell array including a plurality of word lines, a plurality of bit lines intersecting the word lines, and a plurality of memory cells each disposed at an associated one of intersections of the word and bit lines, the plurality of word lines extending in a first direction in parallel to one another, the plurality of bit lines extending in a second direction in parallel to one another, the first direction intersecting the second direction, the memory cell array being defined by a plurality of sides, said plurality of sides including a first side parallel to the word lines, a second side parallel to the bit lines, a third side being opposed to the first side, and a fourth side being opposed to the second side;

a set of sense amplifiers to amplify a set of data read out from the memory cell array to produce a set of amplified data;

a set of first ports, the set of first ports being arranged on the first side and the third side of the memory cell array;

at least one second port which is smaller in bit width than the set of first ports, the at least one second port being arranged on the second side of the memory cell array;

a first select circuit operable to transfer the set of amplified data from the set of sense amplifiers to the set of first ports in parallel to one another, the first select circuit being provided along the first side of the memory cell array; and a second select circuit operable to transfer a selected one of the set of amplified data to the second port, the second select circuit being provided along the first side of the memory cell array, wherein each of a plurality of bit lines is directly connected to a corresponding sense amplifier, a corresponding first select circuit, and a corresponding second select circuit.

30. The semiconductor device according to claim 29, wherein the first select circuit is controlled by at least one first control line and the second select circuit is controlled by a set of second control lines, the first control line extending in the first direction and the set of second control lines extending in the second direction crossing the first direction.

31. The semiconductor device according to claim 30, wherein the word lines extend in the first direction and the bit lines extend in the second direction.

32. The semiconductor device according to claim 29, wherein each of the plurality of first select circuits being arranged on said first side and third side, is connected to a corresponding different bit line, and is connected to said first input/output port on the first side and said first input/output port on the third side.

* * * * *